(12) United States Patent
Hurbi et al.

(10) Patent No.: US 10,527,355 B2
(45) Date of Patent: Jan. 7, 2020

(54) DEVICES, METHODS, AND SYSTEMS FOR THERMAL MANAGEMENT

(71) Applicant: MICROSOFT TECHNOLOGY LICENSING, LLC, Redmond, WA (US)

(72) Inventors: Erin Elizabeth Hurbi, San Francisco, CA (US); Michael Nikkhoo, Saratoga, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 37 days.

(21) Appl. No.: 15/622,015

(22) Filed: Jun. 13, 2017

(65) Prior Publication Data

US 2018/0356156 A1 Dec. 13, 2018

(51) Int. Cl.
*F28C 3/08* (2006.01)
*F28F 13/18* (2006.01)
(Continued)

(52) U.S. Cl.
CPC ............ *F28C 3/08* (2013.01); *F28D 15/0233* (2013.01); *F28D 15/0266* (2013.01);
(Continued)

(58) Field of Classification Search
CPC ...... F28C 3/08; F28C 3/02; F28C 3/04; F28C 3/12; F28F 13/182; F28F 2270/00; F28F 2270/02; F28F 23/02; F28D 15/0233; F28D 15/0266; F28D 15/04; F28D 2015/0216; H01L 23/427; H05K 7/20336
(Continued)

(56) References Cited

U.S. PATENT DOCUMENTS 3,450,192 A 6/1969 Hay
4,387,762 A 6/1983 Rinderle
(Continued)

FOREIGN PATENT DOCUMENTS

WO 2004105947 A2 12/2004

OTHER PUBLICATIONS

Nemec, et al., "Thermal Performance Measurement of Heat Pipe", In Global Journal of Technology & Optimization, vol. 2, Issue 1, Jun. 2011, pp. 104-110.

*Primary Examiner* — Christopher R Zerphey
*Assistant Examiner* — Raheena R Malik
(74) *Attorney, Agent, or Firm* — NovoTechIP International PLLC

(57) ABSTRACT

A heat transfer device, and methods and systems using such devices, including a major surface wall forming a bottom side of the device; a first hermetic chamber of a first design and with the surface wall forming a bottom wall of the first vapor chamber; a second hermetic chamber of a second design, positioned adjacent to the first chamber along a length of the first surface wall, and with the surface wall forming a bottom wall of the second vapor chamber. The first chamber includes a first heat transfer medium and a first wick arranged to transport the first heat transfer medium to an evaporator region of the first chamber. The second chamber includes a second heat transfer medium and a second wick arranged to transport the second heat transfer medium to an evaporator region of the second chamber.

19 Claims, 13 Drawing Sheets

(51) Int. Cl.
*F28F 23/02* (2006.01)
*F28D 15/02* (2006.01)
*F28D 15/04* (2006.01)
*H01L 23/427* (2006.01)
*H05K 7/20* (2006.01)
*F28C 3/04* (2006.01)
*F28C 3/02* (2006.01)
*F28C 3/12* (2006.01)

(52) U.S. Cl.
CPC ............ *F28D 15/04* (2013.01); *F28F 13/182* (2013.01); *F28F 23/02* (2013.01); *H01L 23/427* (2013.01); *H05K 7/20336* (2013.01); *F28C 3/02* (2013.01); *F28C 3/04* (2013.01); *F28C 3/12* (2013.01); *F28D 2015/0216* (2013.01)

(58) Field of Classification Search
USPC .................................................... 165/104.26
See application file for complete search history.

(56) References Cited

U.S. PATENT DOCUMENTS

| | | | |
|---|---|---|---|
| 4,489,777 A | 12/1984 | Del Bagno et al. | |
| 4,616,699 A | 10/1986 | Grote | |
| 4,951,740 A * | 8/1990 | Peterson | F28D 15/046 165/104.26 |
| 5,253,702 A * | 10/1993 | Davidson | F28D 15/0233 165/104.14 |
| 5,771,967 A | 6/1998 | Hyman | |
| 6,302,192 B1 * | 10/2001 | Dussinger | F28D 15/0233 165/104.21 |
| 6,460,612 B1 | 10/2002 | Sehmbey et al. | |
| 7,246,940 B2 | 7/2007 | Storm et al. | |
| 7,431,071 B2 * | 10/2008 | Wenger | F28D 15/0266 165/104.26 |
| 8,050,028 B2 * | 11/2011 | Merz | G02F 1/133308 361/679.47 |
| 8,335,083 B2 | 12/2012 | Yang et al. | |
| 8,807,203 B2 | 8/2014 | MacDonald et al. | |
| 8,896,335 B2 | 11/2014 | Stuckey et al. | |
| 2006/0213648 A1 | 9/2006 | Chen et al. | |
| 2007/0022603 A1 * | 2/2007 | Chuang | B23P 15/26 29/890.032 |
| 2007/0272399 A1 * | 11/2007 | Nitta | F28D 15/0233 165/185 |
| 2015/0060020 A1 * | 3/2015 | Yang | F28D 15/04 165/104.26 |
| 2015/0258547 A1 | 9/2015 | Arciniegas et al. | |
| 2015/0285573 A1 | 10/2015 | Stellman | |
| 2015/0346784 A1 | 12/2015 | Delano et al. | |
| 2016/0209659 A1 | 7/2016 | Nikkhoo et al. | |
| 2016/0209661 A1 | 7/2016 | Nikkhoo et al. | |
| 2016/0212879 A1 | 7/2016 | Nikkhoo et al. | |
| 2016/0212886 A1 | 7/2016 | Nikkhoo | |
| 2016/0212887 A1 | 7/2016 | Nikkhoo | |
| 2016/0212888 A1 | 7/2016 | Nikkhoo et al. | |
| 2016/0363971 A1 | 12/2016 | Delano et al. | |
| 2016/0381832 A1 | 12/2016 | Hurbi et al. | |
| 2017/0049006 A1 | 2/2017 | McLaughlin et al. | |
| 2017/0052575 A1 | 2/2017 | Stellman et al. | |
| 2017/0064868 A1 | 3/2017 | Rush et al. | |
| 2017/0083061 A1 | 3/2017 | Stellman et al. | |
| 2017/0099749 A1 | 4/2017 | Nikkhoo et al. | |
| 2017/0257982 A1 * | 9/2017 | Cheng | H05K 7/20327 |

\* cited by examiner

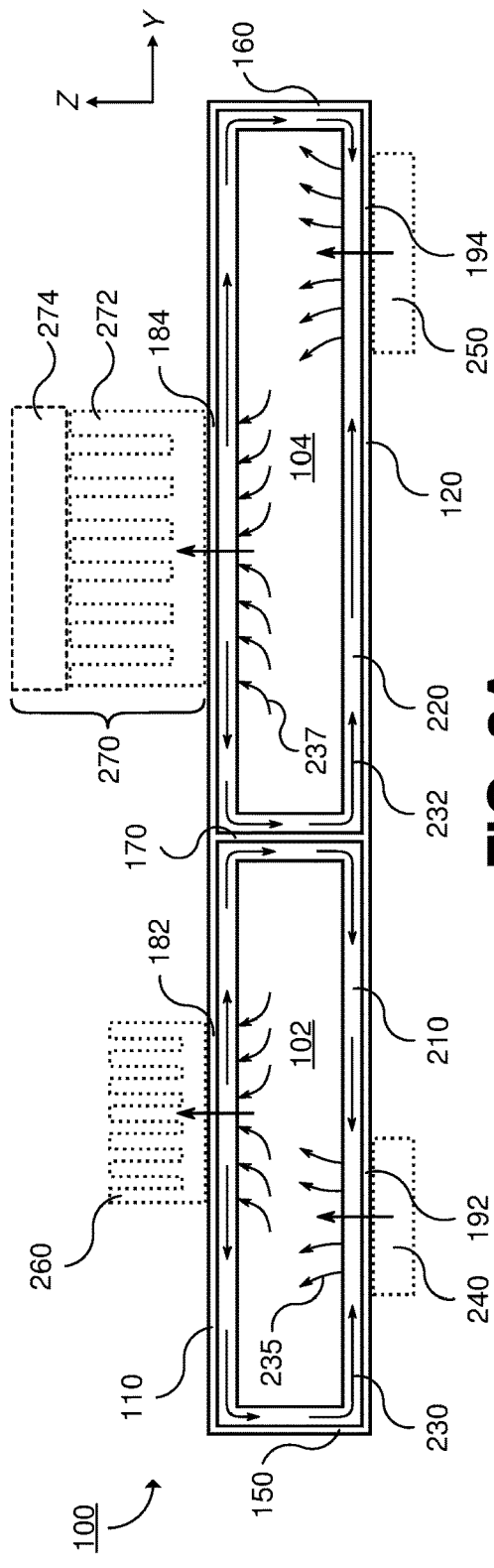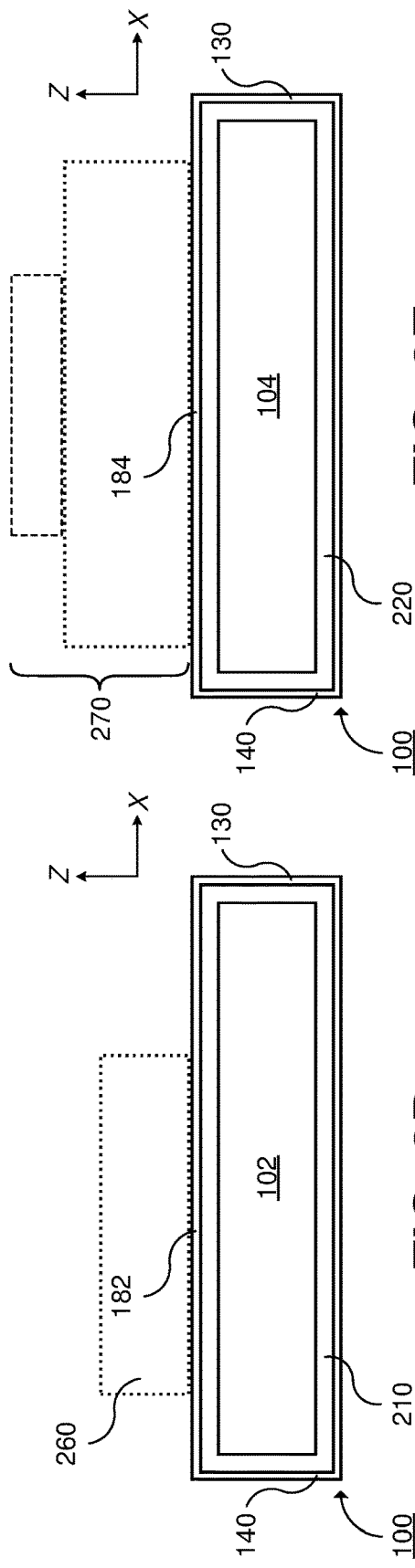

DEVICES, METHODS, AND SYSTEMS FOR THERMAL MANAGEMENT

BACKGROUND

Electronic devices and systems include various electronic components that generate heat during operation, such as, but not limited to, logic processors, graphics processors, signal processing units, batteries, power supplies, display devices, light emitting components, electromechanical components, sensors, amplifiers, digital to analog converters (DACs), analog to digital converters (DACs), radio frequency (RF) transmitters, RF receivers, and system on a chip (SoC) components. It is advantageous to maintain electronic components at lower temperatures, as operating temperature is a significant factor in determining reliability and failure rates. Also, hotter components may degrade over their lifespan, and additional power may be required to compensate for the degradation, which in turn can result in additional charge/discharge cycles for a battery supplying such power. Further, higher temperatures can reduce efficiency or performance; for example, some components may exhibit leakage power dependent on component temperature. Other components may be similarly affected if heat generated by a component is not effectively removed or managed.

Decreases in component and device sizes have increased challenges for thermal management. Miniaturization of electronic components has led to increases in heat flux, with some microprocessors reaching 200 W/cm$^2$. Also, decreases in form factor sizes for electronic devices have led to increasing compact and/or stacked arrangements that increase densities of heat generating components and restrict avenues for heat rejection. Further challenges and constraints are imposed on mobile and wearable electronic devices, as air blowers are often undesirable or impractical in such devices, surfaces that come into contact with users need to be maintained at safe or comfortable temperatures, and surfaces with low thermal resistances, such as a metal exterior surface, can still end up conducting too much heat energy to a user's body even at lower temperatures.

Various techniques have been employed for removing heat from electronic devices, including, for example, heat spreaders, heat pipes, and finned heat sinks, sometimes in combination with air flow from a passive vent or assisted by air blowers. Heat pipes and vapor chambers offer very high thermal conductivities, but their use in portable electronic devices has generally been limited to high heat flux components such as microprocessors and graphics processing units (GPUs). There remain significant areas for new and improved ideas for applying heat pipes and vapor chambers in portable electronic devices, and such improvements are also of benefit for other uses of heat pipes and vapor chambers.

SUMMARY

A heat transfer device for thermal management and an electronic assembly including the heat transfer device. The device includes a substantially continuous surface wall providing a bottom side of the device; a hermetic first chamber of a first design, with the surface wall providing a bottom wall of the first vapor chamber; and a hermetic second chamber of a second design different from the first design, positioned adjacent to the first chamber along a length of the surface wall, with the surface wall providing a bottom wall of the second vapor chamber. A first heat transfer medium is disposed in the first chamber, and a first wick is disposed in the first chamber and arranged to transport a liquid phase of the first heat transfer medium by capillary forces to an evaporator region of the first chamber. A second heat transfer medium is disposed in the second chamber, and a second wick is disposed in the second chamber and arranged to transport a liquid phase of the second heat transfer medium by capillary forces to an evaporator region of the second chamber.

The electronic assembly includes a substantially continuous surface wall; a first hermetic chamber of a first design, with the surface wall providing a bottom wall of the first vapor chamber; a second hermetic chamber of a second design different from the first design, positioned adjacent to the first chamber along a length of the surface wall, with the surface wall providing a bottom wall of the second vapor chamber. A first heat transfer medium is disposed in the first chamber, and a first wick disposed in the first chamber and arranged to transport a liquid phase of the first heat transfer medium by capillary forces to a an evaporator region of the first chamber. A second heat transfer medium is disposed in the second chamber, and a second wick disposed in the second chamber and arranged to transport a liquid phase of the second heat transfer medium by capillary forces to an evaporator region of the second chamber. The electronic assembly may include a first electronic component that generates heat during operation of the electronic assembly, is thermally coupled to the first chamber, and is arranged to vaporize the first heat transfer medium at the evaporator region of the first chamber during operation of the electronic assembly. The electronic assembly may include a second electronic component that generates heat during operation of the electronic assembly, is thermally coupled to the second chamber, and is arranged to vaporize the second heat transfer medium at the evaporator region of the first chamber during operation of the electronic assembly.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 2A illustrates a cross-section view, corresponding to the cross-section labeled "2A" in FIG. 1A, of the heat transfer device illustrated in FIGS. 1A, 1B, and 1C. FIG. 2D illustrates a cross-section view, corresponding to the cross-section labeled "2D" in FIG. 1A, of the heat transfer device illustrated in FIGS. 1A, 1B, 1C, and 2A. FIG. 2E illustrates a cross-section view, corresponding to the cross-section labeled "2E" in FIG. 1A, of the heat transfer device illustrated in FIGS. 1A, 1B, 1C, 2A, and 2D.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings. In the following material, indications of direction, such as "top" or "left," are merely to provide a frame of reference during the following discussion, and are not intended to indicate a required, desired, or intended orientation of the described articles.

In some applications, heat pipes are limited to a small number of components, such as a central processing unit (CPU). Thus, other components are simply left to be air cooled, with or without the assistance of a heat spreader or heat sink(s), and do not realize benefits available from the high thermal conductivity of a heat pipe, such as improved component lifespan or performance. In assembling or disassembling (for example, for repair or maintenance of a device or system) an electronic system using heat pipes, heat pipes can present some difficulties—especially if there are separate heat pipes that need to be routed through the system. As a result, such system often use simple routes for heat pipes, to avoid or reduce such assembly or disassembly issues.

Figure 1A:
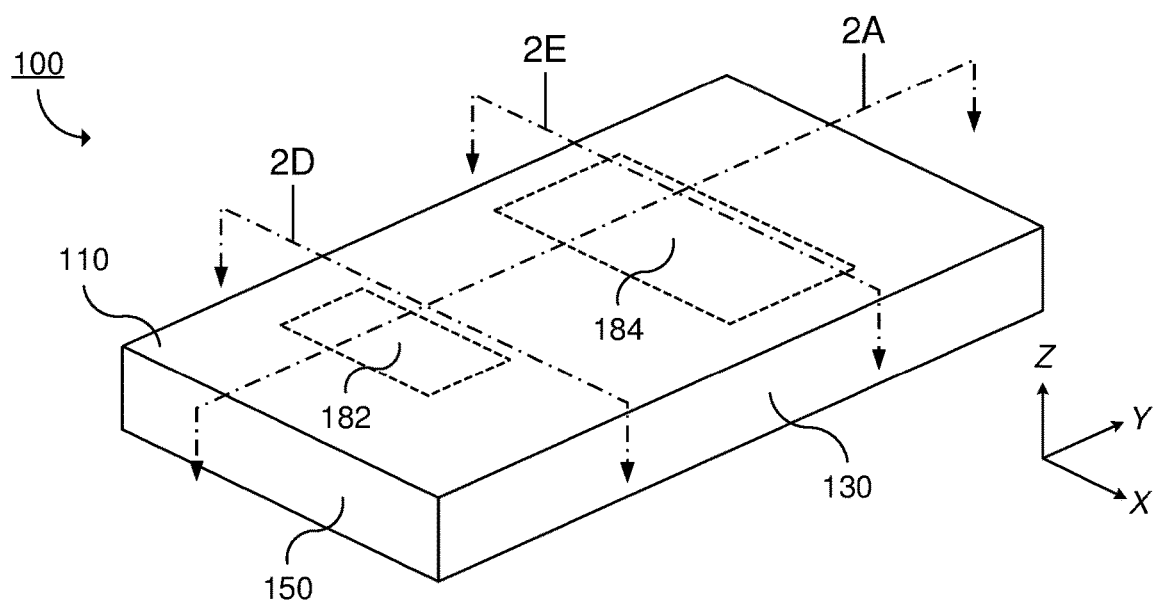
FIG. 1A illustrates an external top isometric view of a fully assembled example heat transfer device embodying aspects of techniques described herein.

FIG. 1A illustrates an external top isometric view of a fully assembled example heat transfer device 100 embodying aspects of techniques described herein. Much as noted previously, the orientation of the heat transfer device 100 illustrated in FIG. 1A is not intended to indicate a required, desired, or intended orientation for the heat transfer device 100. For example, although FIG. 1A illustrates heat transfer device 100 in a substantially horizontal orientation, in normal use it may be used in a more vertical orientation (and the internal structure of the heat transfer device 100 may be optimized for such orientations, such as using gravity to increase mass flow), or in essentially any other orientation. Additionally, although FIG. 1A illustrates heat transfer device 100 as having a substantially parallelepiped form, this is merely an example form.

The heat transfer device 100 includes a top wall 110 providing a major surface wall on a top side of the heat transfer device 100. In this example, the top wall 110 is substantially continuous. Preferably the top wall 110 includes a material with a high thermal conductivity (for example, having a thermal conductivity greater than 150 W/m·K). The top wall 110 includes a first condenser region 182 and a second condenser region 184, which will be discussed in more detail below.

The heat transfer device 100 also includes a front side wall 130 providing a minor surface wall on a front side of the heat transfer device 100. In this example, the front side wall 130 is substantially continuous. The front side wall 130 may include substantially similar materials as the top wall 110, a bottom wall 120 of the heat transfer device 100 (not visible in FIG. 1A), or one or more of the other side walls 140, 150, and 160, or may include a different material, including a material without a high thermal conductivity. In the example illustrated in FIG. 1A, the front side wall 130 is substantially perpendicular to the top wall 110. The heat transfer device 100 also includes a left side wall 150 providing a minor surface wall on a left side of the heat transfer device 100. In this example, the left side wall 150 is substantially continuous. The left side wall 150 may include substantially similar materials as the top wall 110, the bottom wall 120, or one or more of the other side walls 130, 140, and 160, or may include a different material, including a material without a high thermal conductivity. In the example illustrated in FIG. 1A, the left side wall 150 is substantially perpendicular to the top wall 110 and the front side wall 130.

FIG. 1A illustrates locations of a plurality of cross-sections, including a first cross-section labeled "2A" along a Y-Z oriented plane and illustrated in FIG. 2A, a second cross-section labeled "2D" along a first X-Z oriented plane passing through the first condenser region 182 and illustrated in FIG. 2D, and a third cross-section labeled "2E" along a second X-Z oriented plane passing through the second condenser region 184 and illustrated in FIG. 2E.

Figure 1B:
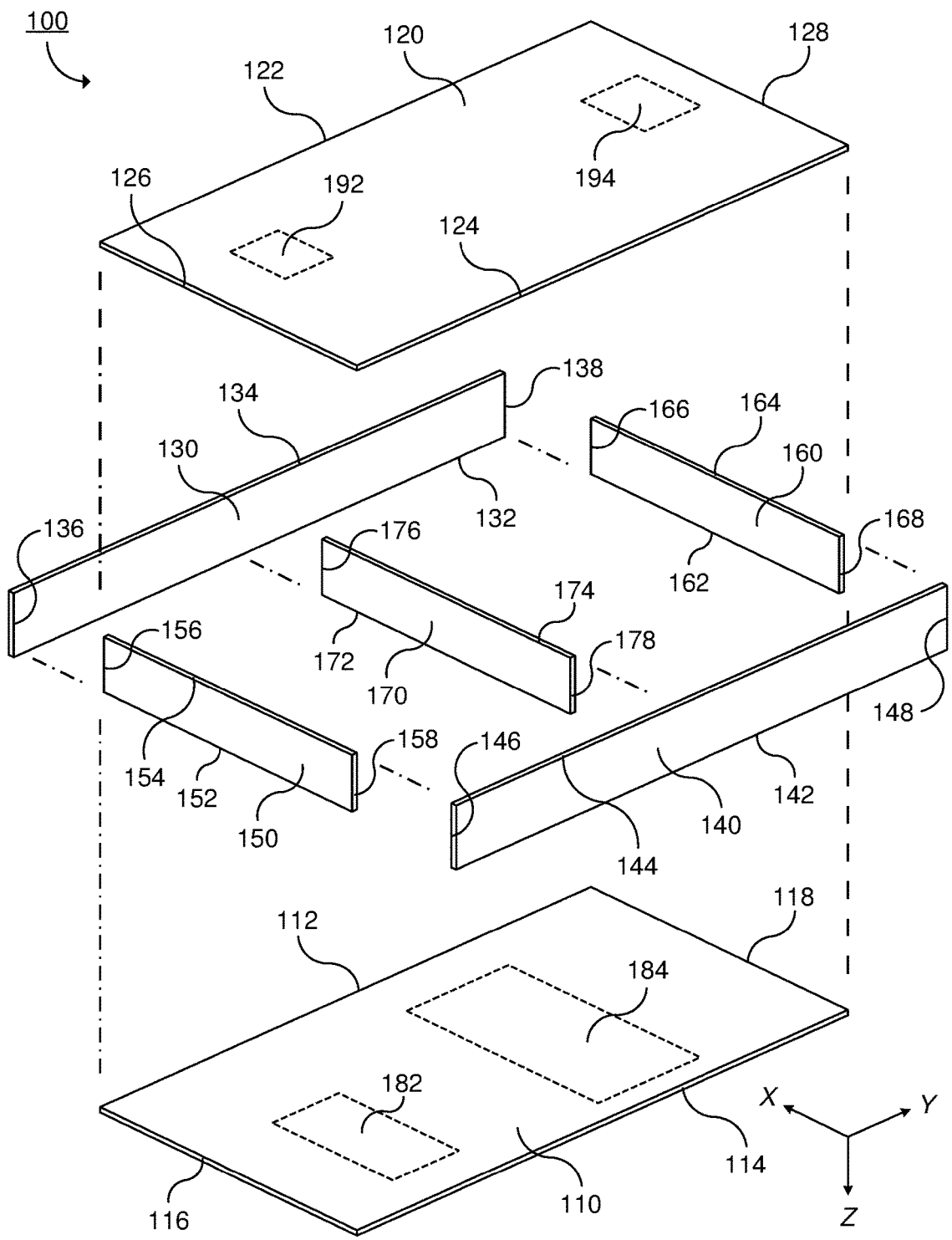
FIG. 1B illustrates an exploded bottom isometric view of the heat transfer device illustrated in FIG. 1A.

FIG. 1B illustrates an exploded bottom isometric view of the heat transfer device 100 illustrated in FIG. 1A. In FIG. 1B, the heat transfer device 100 has been rotated 180 degrees about the Y axis with respect to the orientation shown in FIG. 1A. For convenience of illustration and discussion, only walls 110, 120, 130, 140, 150, 160, and 170 are illustrated in FIG. 1B, and certain internal features, such as wicks, are not illustrated. It is noted that although walls 110, 120, 130, 140, 150, 160, and 170 are illustrated as discrete pieces in FIG. 1B, and the below description discusses walls 110, 120, 130, 140, 150, 160, and 170 being coupled together, this is not intended to suggest that the heat transfer device 100 is or should be assembled from such discrete pieces (such as by welding them together). For example, two or more of the walls 110, 120, 130, 140, 150, 160, and 170 might be formed together by casting a mold, or forging or stamping them from a single piece of metal.

The heat transfer device 100 includes the bottom wall 120 providing a major surface wall on a bottom side of the heat transfer device 100. In this example, the bottom wall 120 is substantially continuous. The bottom wall 120 may include a material with a high thermal conductivity, and may include substantially similar materials as the top wall 110. The bottom wall 120 includes a first evaporator region 192 and a second evaporator region 194, which will be discussed in more detail below. In the example illustrated in FIGS. 1A and 1B, the bottom wall 120 is substantially parallel to the top wall 110, and the lengths of each of the edges 122, 124, 126, and 128 for the bottom wall 120 are substantially equal to the lengths of the edges 112, 114, 116, and 118 of the top wall 110, respectively.

The heat transfer device 100 also includes a back side wall 140 providing a minor surface wall on a back side of the heat transfer device 100. In this example, the back side wall 140 is substantially continuous. The back side wall 140 may include substantially similar materials as the top wall 110, the bottom wall 120, or one or more of the other side walls 130, 150, and 160, or may include a different material, including a material without a high thermal conductivity. In the example illustrated in FIGS. 1A and 1B, the back side wall 140 is substantially perpendicular to the top wall 110 and substantially parallel to the front side wall 130. The heat transfer device 100 also includes a right side wall 160 providing a minor surface wall on a right side of the heat transfer device 100. In this example, the right side wall 160 is substantially continuous. The right side wall 160 may include substantially similar materials as the top wall 110, the bottom wall 120, or one or more of the other side walls 130, 140, and 150, or may include a different material, including a material without a high thermal conductivity. In the example illustrated in FIGS. 1A and 1B, the right side wall 160 is substantially perpendicular to the top wall 110 and the front side wall 130, and substantially parallel to the left side wall 150.

The heat transfer device 100 also includes an interior dividing wall 170 which, in the example illustrated in FIGS. 1A and 1B, divides an interior of the heat transfer device 100 into two separate chambers: a left chamber 102 positioned between the dividing wall 170 and the left side wall 150, and a right chamber 104 positioned adjacent to the left chamber 102 along a length of the bottom wall 120 in the direction of the Y axis. Left chamber 102 and right chamber 104 each function as, and each may each be referred to as, a vapor chamber and/or a heat pipe. Examples of vapor chambers are described in U.S. Patent Application Publication No. 2015/0346784 (published on Dec. 3, 2015), which is incorporated herein by reference in its entirety. In the example illustrated in FIGS. 1A and 1B, the left chamber 102 is immediately adjacent to the right chamber 104. The left chamber 102 and the right chamber 104 are not indicated in FIG. 1B, but are illustrated in FIGS. 1C, 2A, 2D, and 2E. In the example illustrated in FIGS. 1A and 1B, the dividing wall 170 is substantially perpendicular to the top wall 110, bottom wall 120, the front side wall 130, and the back side wall 140. The dividing wall 170 may include substantially similar materials as any of the other walls 110, 120, 130, 140, 150, and 160, or may include a different material. In some implementations, the dividing wall 170 includes a material with a low thermal conductivity to reduce thermal crosstalk between the left chamber 102 and the right chamber 104. In the example illustrated in FIGS. 1A and 1B, the walls 110, 120, 130, 140, 150, 160, and 170 are each plates of uniform thickness (although the wall are not necessarily the same thicknesses).

The left chamber 102 and the right chamber 104 are each hermetically sealed (or "hermetic") in ordinary operation, both from the external environment outside of the heat transfer device 100 and from one another. Sealing of the walls 110, 120, 130, 140, 150, 160, and 170 may be performed using, for example, welding (including, but not limited to, resistance heat welding, laser welding, ultrasonic welding, friction welding, stir friction welding), brazing, or other bonding techniques. Welding for the interior dividing wall 170 may be visible on the exterior of heat transfer device 100. Performance for such hermetic sealing may be, for example, a loss of no more than 1% per year of a working fluid sealed within a chamber. Once fully assembled, as illustrated in FIG. 1A, the heat transfer device 100 is hermetically sealed along each of the edges 122, 124, 126, 128, 132, 134, 136, 138, 142, 144, 146, 148, 152, 154, 156, 158, 162, 164, 166, 168, 172, 174, 176, and 178.

Figure 1C:
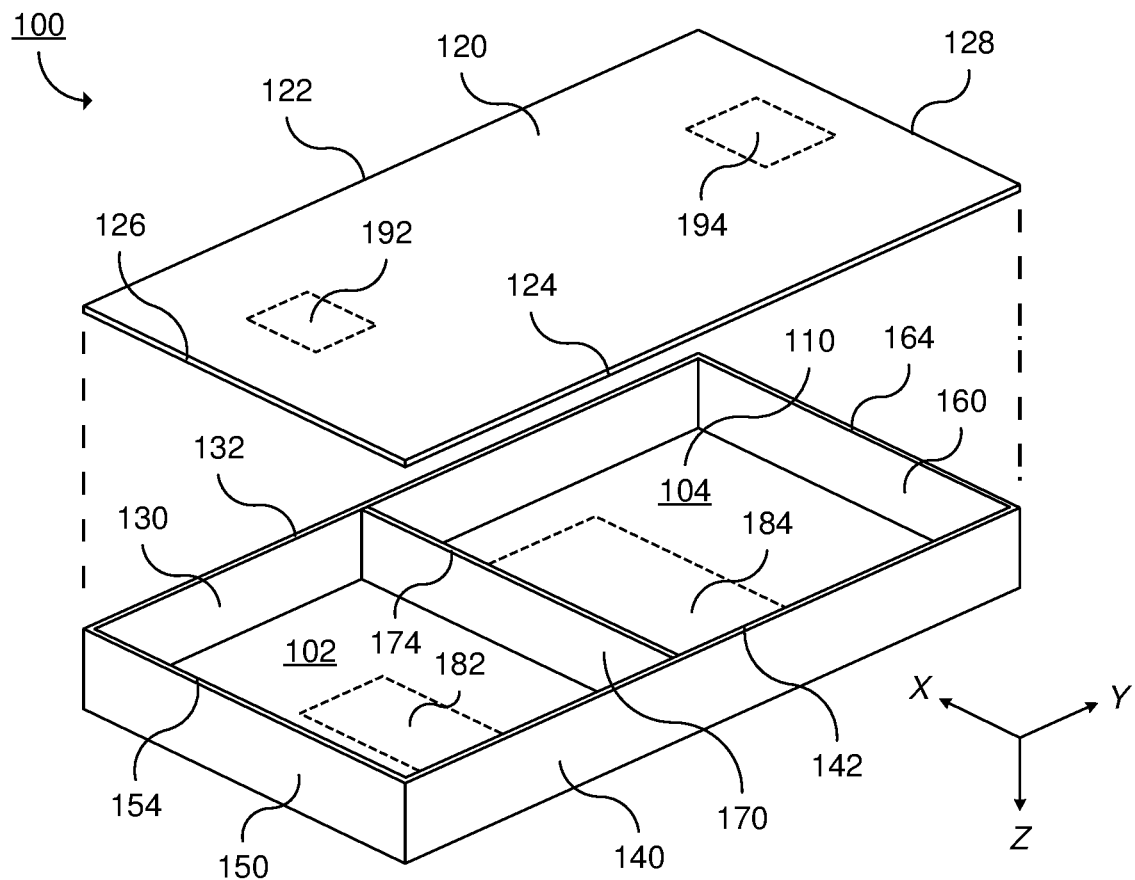
FIG. 1C illustrates another exploded bottom isometric view of the heat transfer device illustrated in FIGS. 1A and 1B, with only a bottom wall removed from the remaining walls.

FIG. 1C illustrates another exploded bottom isometric view of the heat transfer device 100 illustrated in FIGS. 1A and 1B, with only the bottom wall 120 removed from the remaining walls. In this view, the left chamber 102 defined by the walls 110, 120, 130, 140, 150, and 170 is shown, and the right chamber 104 defined by the walls 110, 120, 130, 140, 160, and 170 is shown. Additionally, FIG. 1C illustrates aspects of a method of making the heat transfer device 100, in which walls 110, 130, 140, 150, 160, and 170 are integrated, an interior surface of the bottom wall 120 is processed to define structures thereon (such as wicks), the bottom wall 120 is attached to the remaining walls 110, 130, 140, 150, 160, and 170, and hermetic sealing of the chambers 102 and 104 is completed.

FIG. 2A illustrates a cross-section view, corresponding to the cross-section labeled "2A" in FIG. 1A, of the heat transfer device 100 illustrated in FIGS. 1A, 1B, and 1C. In this illustration, the left chamber 102 and the right chamber 104 are each hermetically sealed as discussed above. A first heat transfer medium is disposed within the hermetically sealed left chamber 102, and is responsible for transferring heat received at the first evaporator region 192 to the first condenser region 182. Although in some examples the first heat transfer medium may be in a solid phase when the left chamber 102 is not being operated, the first heat transfer medium may be referred to as a "working fluid," as in operation heat is transferred via transitions between a liquid phase 230 and a vapor phase 235 of the first heat transfer medium. Suitable materials for the first heat transfer medium at the relatively lower temperatures involved with consumer electronics include, but are not limited to, water, ammonia, pentane, ethanol, methanol, Flutec PP2, Flutec PP9, carbon tetrachloride, benzene, acetone, isopropanol, toluene, and heptane. Similarly, a second heat transfer medium, much as described above for the first heat transfer medium, is disposed within the hermetically sealed right chamber 104, and in operation transitions between a liquid phase 232 and a vapor phase 237. In some implementations, the first heat transfer medium may be different than the second heat transfer medium to achieve different heat transfer characteristics between the left chamber 102 and the right chamber 104. It is noted that in some embodiments of the heat transfer device 100, left chamber 102 may not yet have been filled with the first heat transfer medium and right chamber 104 may not yet have been filled with the second heat transfer medium.

Additionally, FIG. 2A illustrates wicks 210 and 220, which were not illustrated in FIGS. 1A, 1B, and 1C. Although FIG. 2A illustrates an example in which wick 210 covers the entire interior surface of the left chamber 102 and wick 220 covers the entire interior surface of the right chamber 104, in other examples wick 210 and/or wick 220 may be present on only a portion of the interior surfaces of their respective chambers 102 and 104. For example, if the second condenser region 184 and the second evaporator region 194 were both positioned on the bottom wall 120, it might be suitable for wick 220 to only be present on the interior surface of the bottom wall 120. Wick 210 is arranged to transport the liquid phase 230 by capillary forces to first evaporator region 192. Wick 220 is arranged to transport the liquid phase 232 by capillary forces to second evaporator region 194.

There are many materials, structures, arrangements and combinations of structures, and techniques for forming such structures that are suitable for wicks 210 and 220. Wick 210 may include one or more porous media that may be attached to one or more interior surfaces of the left chamber 210, such as, but not limited to, a mesh (such as a woven metal wire mesh), a twill (such as a woven metal twill fabric), a felt (such as a metal metallic felt), a metallic foam, and knitted ceramic fibers. Each porous medium may be of a selected pore size or average pore size, which may be selected to achieve desired mass flow rate performance characteristics. A portion of wick 210 may be formed by adding material to a bulk material for one or more of the walls 110, 120, 130, 140, 150, and 170 that define the left chamber 102. In one example, a porous medium may be formed directly on an interior surface of the left chamber 102, such as by sintering a metallic powder of a selected particle size. In another example, structures may be added using lithographic techniques. A portion of wick 210 may be formed by selectively removing or displacing portions of a bulk material for one or more of the walls 110, 120, 130, 140, 150, and 170. In one example, channels or arteries of selected sizes and arrangements may be formed in bottom wall 120 to increase a flow rate of liquid phase 230. U.S. Patent App. Pub. No. 2006/0213648 (published on Sep. 28, 2006), which is incorporated herein by reference in its entirety, describes examples of applying a mold or a roller under pressure to a substrate material to form grooves therein. In another example, microlithographic techniques, including but not limited to photolithographic methods or "direct writing" methods such as selective laser melting (SLM), may be used to selectively form capillary structures. U.S. Pat. No. 8,807,203 (issued on Aug. 19, 2014), which is incorporated herein by reference in its entirety, describes examples etching a titanium substrate to form pillars for driving a liquid by capillary forces. Hydrophobic or hydrophilic materials may be selectively applied to one or more interior surfaces of the left chamber 102 to modulate flow characteristics of the wick 210. For example, a capillary structure may receive a surface treatment that increases its hydrophilicity, or a portion of the interior surfaces of the left chamber 210 without capillary structures may receive a surface treatment that increases their hydrophobicity. Surface roughness may be selectively controlled on portions of the interior surfaces of the left chamber 210 to control locations at which condensation or accumulation of the liquid phase 230 occurs. In some portions, wick 210 may include multiple layers of wicking structures; for example, channels covered by a porous medium or multiple layers of porous media with different pore sizes. Wick 210 may include multiple wicking structures that are not in direct contact with each other. Similar options are also available for wick 220. Different structures, arrangements of structures, and/or materials may be used for wick 210 and wick 220.

The left chamber 102 includes the first evaporator region 192, which includes a region of the bottom wall 120 and a region of the wick 210 immediately adjacent to that region of the bottom wall 120. The first evaporator region 192 may be referred to as an "evaporator" or an "evaporator portion." The left chamber 102 includes the first condenser region 182, which includes a region of the top wall 110 and a region of the wick 210 immediately adjacent to that region of the top wall 110. The first condenser region 182 may be referred to as a "condenser" or a "condenser portion." Although only one condenser region 182 and only one evaporator region 192 are illustrated for left chamber 102, in some examples the left chamber 102 may include multiple evaporator regions and/or multiple condenser regions. Each condenser region and evaporator region included in the left chamber 102 may be positioned on any of the walls 110, 120, 130, 140, and 150 defining the left chamber 102. In some examples or under some conditions, a portion of the dividing wall 170 may function as a condenser region. In some examples, a condenser region and evaporator region may be positioned on a same wall or surface of the left chamber 102; for example, first condenser region 182 and first evaporator region 192 might both be positioned on the bottom wall 120. Evaporator regions, such as second evaporator region 194, and condenser regions, such as second condenser region 184, included in the right chamber 104 may be similarly arranged.

In normal operation, as heat is generated by a heat source 240 (illustrated in dashed lines) that is thermally coupled to first evaporator region 192, the first evaporator region 192 (including respective regions of bottom wall 120 and wick 210) transfers the heat to the liquid phase 230 contained in the wick 210. In this arrangement, the heat source 240 is arranged to vaporize the liquid phase 230, with the heat generated by the heat source 240 causing a transition of the first heat transfer medium from its liquid phase 230 to its vapor phase 235, transferring the heat from heat source 240 through the latent heat of vaporization. The evaporation of liquid phase 230 from the wick 210 at the first evaporator region 192 causes a void which creates a capillary force through surface tension that draws the liquid phase 230 through the wick 210, transporting the liquid phase 230 to the first evaporator region 192. Thus, the wick 210 allows for continuous replenishment of the liquid phase 230 for first evaporator region 192, thereby sustaining a continuous evaporation-condensation cycle. The vapor phase 235 is transported, through a cavity within the left chamber 102 not occupied by wick 210 or other structures, to first condenser region 182. At first condenser region 182, the vapor phase 235 condenses back into its liquid phase 230, releasing the latent heat of vaporization at first condenser region 182.

The heat source 240 may also be referred to as a "heat generating component" of "heat generating element". For example, an electronic device or system may include various electronic components that generate heat during operation, as previously discussed. The electronic component may be attached to a substrate such as a printed circuit board (PCB). The electronic component may include or be included in a package or chip carrier providing mechanical connections, electrical connections, and/or protection, such as, but not limited to, a ball grid array (BGA) surface-mount packaging or a through-hole packaging.

A heat rejection device 260 is thermally coupled to the exterior of the top wall 110 at the first condenser region 182. Heat rejection may also be referred to as "heat dissipation." To improve heat transfer, a thermal interface material (TIM), such as a thermally conductive grease or mastic, may be applied at a contact between heat source 240 and first evaporator region 192 and/or at a contact between heat rejection device 260 and first condenser region 182. The heat rejection device 260 may be arranged in various ways to accept, store, and dissipate heat that is communicated from the first condenser region 182 to the heat rejection device 260. Generally, the heat rejection device 260 as a heat exchanger that uses fins, pins, and/or other mechanical structures to increase a surface area in contact with air or another cooling medium to facilitate heat dissipation. In some implementations, an external surface of a system housing may be used to perform heat rejection via a thermally conductive metal surface. One possible benefit of the two chambers 102 and 104 is that one chamber may be arranged to maintain that external surface at a safe or comfortable temperature for contact by a user, while the other chamber is operated with a higher temperature. In some examples, a heat pipe or a vapor chamber be used as heat rejection device 260. In some examples, a single heat rejection device may be coupled to multiple condenser regions included in one or more vapor chambers, such as a single heat sink shared by first and second condenser regions 182 and 184. In some examples, a portion of a heat rejection device may be incorporated into one or more walls of the left chamber 102.

In some implementations, a heat rejection device may include or be arranged in conjunction with a suitable fluid mover that provides an active cooling mechanism for thermal control. For example, a heat rejection device 270 coupled to the second condenser region 184 includes an air-cooled heat sink 272 and an attached air blower 274. The fluid mover may be selectively enabled or disabled in response to a temperature. For example, the fluid mover may be enabled in response to a measured temperature exceeding a threshold temperature. Rates at which the fluid mover moves fluid, which may be measured in terms of a rate of fluid volume over time, may be selectively controlled in response to a temperature. For example, a rate of air flow generated by blower 274 may be increased in response to an increased measured temperature to increase a rate of heat rejection by the heat rejection device 270.

The blower 274 may be arranged to pull air from an exterior of a system housing (not illustrated in FIG. 2A) through intake vents into an interior of the housing. The blower 274 may be arranged in various ways, such as an axial fan or a centrifugal blower for moving air. Although examples are described herein in relation to air cooling, comparable techniques may be used in other types of fluid cooling systems employing different types of gases or even liquids. Accordingly, pumps, impellers, different types of blowers, fans, and other types of fluid movers may be employed in alternative designs and/or in conjunction with other types of cooling fluids. Additionally, although a single blower 274 is illustrated, multiple fluid movers may be employed in various implementations. Additionally, a single fluid mover may be shared by two heat rejection devices, such as a first heat rejection device thermally coupled to a first condenser and a second heat rejection device thermally coupled to a second condenser.

The blower 274 may be arranged to disperse air into the interior of the housing via one or more flow conduits to heat sink 272, and in some embodiments various heat-generating devices included in the housing. Various types of flow conduits are contemplated, such as, but not limited to, channels formed or otherwise included in the housing, arrangements of device elements such as components and circuit boards, tubes, manifolds, baffles, and the heat transfer device 100. Cooling air that is drawn into the housing by the blower 274 operates to cool the system by convective transfer, which removes heat from the system by heating the air. The heated air flows to exhaust vents where the heated air is expelled from the system.

The term "active," as applied to heat rejection, generally refers to heat rejection that requires external energy output. One example of active heat rejection includes removing heat via forced air convection by using a blower to provide and/or exhaust cooling air, such as with the heat rejection device 270 illustrated in FIG. 2A. Another example includes removing heat via conduction using a chiller and a heat exchanger. In contrast, the term "passive," as applied to heat rejection, generally refers to heat rejection without requiring external energy output. Example passive heat rejection techniques include heat rejection via natural convection, conduction, and/or radiation. In some examples, an active heat rejecter may selectively be operated in a passive mode as a passive heat rejecter. For example, a blower may be disabled below a threshold temperature, and instead rely on passive heat rejection via unforced air flow through a heat sink.

Although condensation of the vapor phase 235 may occur at other regions of the left chamber 102 (for example, due to radiation, conduction, or convection of heat at other regions), in ordinary operation a first proportion of more than 50% of the heat received via one or more evaporator regions included in the left chamber 102 is transferred out of the heat transfer device 100 via the one or more condenser regions included in the left chamber 102, due to heat rejection devices, such as heat rejection device 260, reducing the thermal resistance at the condenser regions they are coupled to. In some examples, the first proportion is more than 60%. In some examples, the first proportion is more than 80%. In some examples, the first proportion is more than 90%. In some implementations, the heat rejection device 260 is arranged to receive a second proportion of more than 50% of latent heat transferred out of the left chamber 102 by condensation of the vapor phase 235. In some examples, the first proportion is more than 60%. In some examples, the second proportion is more than 80%. In some examples, the second proportion is more than 90%. The left chamber 102 may also receive heat at other regions than its evaporator regions. In some implementations, a first proportion of heat received by the left chamber 102 that is received via its one or more evaporator regions (in the aggregate) in ordinary operation is more than 50%. In some examples, the first proportion is more than 60%. In some examples, the first proportion is more than 80%. In some examples, the first proportion is more than 90%. It is noted that for many wick implementations, in which a liquid phase can flow by capillary forces in either direction, the heat transfer device 100 can transfer heat in a "reverse" direction, with heat being input at the first condenser region 182 and heat being output at the first evaporator region 192. In some such implementation, this "reversed" arrangement may achieve comparable thermal efficiency to the ordinary "forward" arrangement. The right chamber 104 illustrated in FIG. 2A operates much as described for left chamber 102, receiving heat from a heat source 250 thermally coupled to the second evaporator region 194 to transform liquid phase 232 into vapor phase 237, and transferring a majority of that received heat out via a heat rejection device 270 thermally coupled to second condenser region 184.

The left chamber 102 may operate as a "thermal transformer," receiving heat at first evaporator region 192 with a first heat flux, and ejecting heat at first condenser region 182 with a second heat flux that is substantially lower than the first heat flux. An area of contact between the first condenser region 182 and the heat rejection device 260 can be selected to adjust a ratio between the first heat flux and the second heat flux, which may affect a temperature at first evaporator region 192, a temperature at first condenser region 182, a temperature of vapor phase 235, a temperature of heat source 240, a temperature of heat rejection device 260, and/or a temperature of a fluid passed through the heat rejection device 260. In some examples, the heat rejection device 260 is thermally coupled to first condenser region 182 via a first amount of surface area of an exterior surface of the left chamber 102, the heat rejection device 270 is thermally coupled to second condenser region 184 via a second amount of surface area of an exterior surface of the right chamber 104, and the first surface area is substantially different than (including being greater than or less than) the second surface area. In some examples, the difference is more than 30%. In some examples, the difference is more than 60%. In some examples, the difference is more than 100%.

With the two chambers, left chamber 102 and right chamber 104, two separate "thermal domains" may be established: a first thermal domain for the left chamber 102 of a first design and a second thermal domain for the right chamber 104 of a second design different from the first design. A thermal domain may also be referred to as a "heat transfer route" or a "heat rejection path." Each of the first and second thermal domains may be tuned to achieve different heat transport properties in operation arising out of differences between the first and second designs. Benefits of having the two thermal domains include, but are not limited to, maintaining different component and/or system temperatures with a single heat transfer device, and/or decoupling heat generated for one thermal domain from affecting temperatures for other thermal domains. There are a number of such design differences that may be employed for such tuning, including, but not limited to:

A first total internal volume available for vapor transport in a first chamber being substantially greater than a second total internal volume available for vapor transport in a second chamber. For example, excluding wicks and other internal structures. In some implementations, the first volume is at least 20% greater than the second volume. In some implementations, the first volume is at least 50% greater than the second volume. In some implementations, the first volume is at least 100% greater than the second volume.

The first heat transfer medium including a different material than the second heat transfer medium. For example, the left chamber 102 may contain water and the right chamber 104 may contain ammonia.

A first total mass of a heat transfer medium included in a first chamber being substantially greater than a second total mass of a heat transfer medium included in a second chamber. This may affect, for example, performance at higher temperatures.

Different structures for wick 210 and wick 220. For example, the wick 210 and the wick 220 may have substantially different average thicknesses, have substantially different average pore sizes, have substantially different porosities, or include different materials. This may affect, for example, mass flow rate of a working fluid from a condenser region to an evaporator region.

Different arrangements for wick 210 and wick 220 on the interiors of their respective chambers 102 and 104. For example, wick 210 may have a first arrangement to improve transport of liquid phase 232 to evaporator region.

Number, size, shape, and/or arrangement of internal structures. Structures may be included within a chamber that facilitate or impede flow of a liquid phase or a vapor phase. Structures may be included which maintain an inventory of excess liquid phase material. In some examples, such structures may include a wick portion to provide an additional path for supplying a liquid phase to an evaporator portion.

Difference in wall and/or wick thicknesses at evaporator regions, which may affect thermal resistance and rate of evaporation at evaporator regions.

Difference in wall and/or wick thicknesses at condenser regions, which may affect thermal resistance and rate of condensation at condenser regions.

Chamber shapes, which may affect vapor phase and/or liquid phase flow rates. For example, a reduced cross-sectional area for vapor phase flow can reduce and/or limit thermal throughput of a vapor chamber. For example, internal chamber heights may be different or varied differently.

Figure 2B:
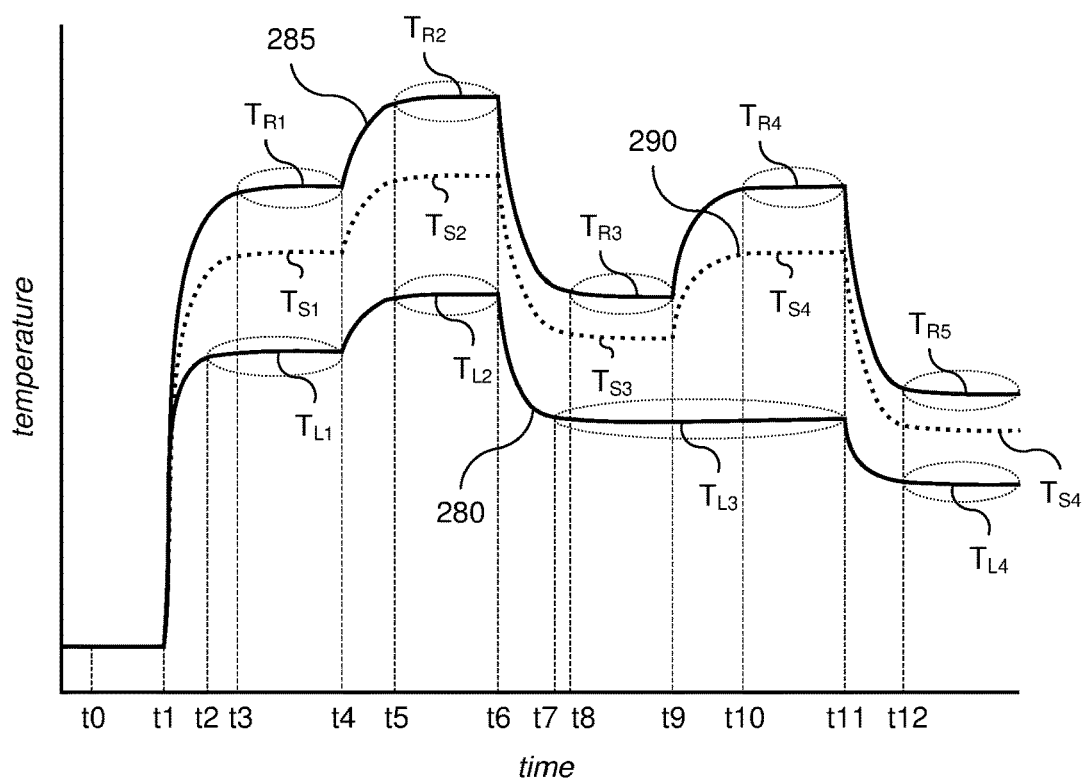
FIG. 2B illustrates an example graph of temperatures over time for the two thermal domains provided by the heat transfer device illustrated in FIG. 2A and a single thermal domain provided by a conventional single-chambered vapor chamber.

FIG. 2B illustrates an example graph of temperatures over time for the two thermal domains provided by the heat transfer device 100 illustrated in FIG. 2A and a single thermal domain provided by a conventional single-chambered vapor chamber. For FIG. 2B, the heat transfer device 100 is included in a system that also includes, thermally coupled to the heat transfer device 100, the heat sources 240 and 250 and the heat rejection devices 260 and 270. The system may include additional elements such as, but not limited to, a chassis, printed circuit boards (PCBs), and/or a housing. Curve 280 shows temperatures, including the steady-state temperatures $T_{L1}$, $T_{L2}$, $T_{L3}$, and $T_{L4}$, for the first thermal domain for the left chamber 102 resulting from heat received by the left chamber 102 from the heat source 240. Curve 285 shows temperatures, including the steady-state temperatures $T_{R1}$, $T_{R2}$, $T_{R3}$, $T_{R4}$, and $T_{R5}$, for the second thermal domain for the right chamber 104 resulting from heat received by the right chamber 104 from the heat source 250 over the same period of time as curve 280. Over that period of time, rates of heat generated by the heat sources 240 and 250 changes over time, and the curves 280 and 285 reflect these changes in heat output. Curve 280 and/or curve 285 may reflect changes in levels of operation of active heat rejection by heat rejection device 260 and/or heat rejection device 270; for example, a blower may be enabled or its air flow rate varied in response to temperature. Curve 290 shows temperatures, including the steady-state temperatures $T_{S1}$, $T_{S2}$, $T_{S3}$, $T_{S4}$, and $T_{S5}$, in an example in which the system has a conventional single-chambered vapor chamber in place of the heat transfer device 100, with the heat sources 240 and 250 and the heat rejection devices 260 and 270 similarly arranged and all thermally coupled to the single-chambered vapor chamber. For curve 290, the heat sources 240 and 250 generate heat in the same amounts and at the same relative times as for curves 280 and 285, and heat rejection devices 260 and 270 are also operated (including changes in levels of active heat rejection) as for curves 280 and 285.

Curve 280 may be a temperature measured at a first point that is associated with the first thermal domain and located in, on, or adjacent to the system. Examples of such points include, but are not limited to; heat source 240 (the temperature of which may be measured at, or inferred by a measurement at, a position in, on, or adjacent to heat source 240); bottom wall 120 at or adjacent to first evaporator region 192; a position in the interior of the left chamber 102 where vapor phase 235 is present (for example, around the first evaporator region 192, around the first condenser region 182, or a point between the first evaporator region 192 and first condenser region 182); top wall 110 at or adjacent to first condenser region 182; heat rejection device 260 (the temperature of which may be measured at, or inferred by a measurement at, a position in, on, or adjacent to heat rejection device 260); within a fluid (such as air) output and heated by heat rejection device 260, including at our near an exhaust vent of the system; an element of the system, such as an electronic component, receiving heat output by the first thermal domain; and a portion of a human body, including skin, receiving heat output by the first thermal domain. Curve 280 may be an average temperature, including, but not limited to, an average of temperatures measured at multiple points such as those described above for the first point, an average temperature of a surface area, or an average temperature within a volume (for example, an average temperature of vapor phase 235). One or more of such points or average temperatures may be of particular interest for designing, implementing, and operating the system, such as, but not limited to, to avoid exposing a user to uncomfortable or unsafe temperatures, or to avoid exceeding a maximum temperature for a component. Curve 290 may be a temperature measured at a second point, different that the first point, that is associated with the second thermal domain and located in, on, or adjacent to the system, or an average temperature, much as discussed above for curve 280. In general, it is preferred that the temperatures measured for curve 280 are more significantly affected by the first thermal domain than the second thermal domain, and that the temperatures measured for curve 285 are more significantly affected by the second thermal domain than the first thermal domain.

The temperatures may be measured while operating the system under a condition of interest, or a condition simulating a condition of interest. For example, for an electronic device that is intended to be worn by a user, measurements may be performed while the device is worn by a person or mounted on an apparatus simulating aspects relevant to thermal performance, as it may be more difficult for the device the reject heat while being worn. The temperatures may be measured while operating the system in a controlled environment, which may reflect an ordinary operating environment or a more extreme environment. Temperatures may be measured while operating the system or a portion of the system in a selected manner. For example, particular functions of the system may be selectively enabled, a processor may be operated at a selected performance level or clock speed, or a portion of the system may be operated in a selected mode or at a selected level. The selected manner may include a portion of the system being operated in an atypical manner, such as with a blower disabled, to ensure thermal performance meets a desired target under "worst case" conditions. In some examples, heat sources 240 and 250 may be operated so as to supply substantially equal heat loads to their respective evaporator regions 192 and 194.

Properties of the heat transfer device 100 and/or the system in which the heat transfer device is included may be measured in terms of "steady-state" operating temperatures and/or measured at a time that a steady state operating temperature or temperatures have been reached for the first thermal domain and/or the second thermal domain. This may also be referred to as a "thermal steady-state." When a steady-state temperature has been reached for a thermal domain, that thermal domain and the vapor chamber included therein may be referred to as being operated in a steady-state. For purposes of this disclosure, the terms "steady-state operation" and "steady-state operating" do not apply to circumstances that an electronic system, in which the heat transfer device 100 is included, is not receiving power, is turned off, is in a sleep state (such as ACPI global state G1), or other such circumstances in which no or very little heat is being generated by heat source 240 and/or heat source 250. For example, although an unpowered electronic device may match a temperature of its surroundings (for example, "room temperature") and remain at or around that temperature for a period of time, the device is not in "steady-state operation" or at a "steady-state operating temperature" during that period of time.

As noted above, curves 280 and 285 reflect changes in temperatures for their respective first and second thermal domains in response to changes in heat generated by heat sources 240 and 250. As a nonlimiting example, in a heat source including a microprocessor, increased heat generation may occur during periods of more intensive processing and/or operation at increased clock rates. At time t0, neither of the heat sources 240 and 250 are generating heat. For example, the heat sources 240 and 250 may be included in an electronic device that is turned off. At time t1, heat sources 240 and 250 begin generating heat which is received by their respective left chamber 102 and right chamber 104, and the temperatures measured for curves 280 and 285 begin increasing. For example, power may be applied to the system. In this example, from about time t1 to about time t4, heat source 240 generates a heat load at a first level and heat source 250 generates a heat load at a second level. From time t1 to about time t2, the temperature at the first point for curve 280 is transient (or "in a transient state" or "in transition"), and continues to increase until it reaches a steady-state temperature $T_{L1}$ about time t2. From about time t2 to about time t4, the first thermal domain and the left vapor chamber 102 may be referred to as operating in a steady-state.

Likewise, beginning at time t1, the temperature at the second point for curve 285 is transient for a longer time until it reaches a steady-state temperature $T_{R1}$ about time t3. From about time t3 to about time t4, the second thermal domain and the right vapor chamber 104 may be referred to as operating at a thermal steady-state. During periods of time that all of the thermal domains for the heat transfer device 100 (in this example, both chambers 102 and 104) are at thermal steady-state, such as from about time t3 to about time t4, the heat transfer device 100 may be referred to as operating in a thermal steady-state, and, in some examples, the system may also be referred to as operating in a thermal steady-state. The steady-state temperature $T_{R1}$ is substantially higher than the steady-state temperature $T_{L1}$. For example, in a consumer electronic device, a difference between steady-state temperature $T_{R1}$ and the steady-state temperature $T_{L1}$ may be at least 5° C., at least 10° C., or at least 20° C.

At about time t4, both heat sources 240 and 250 increase their rates of heat generation. For example, the heat source 240 may include a microprocessor and the heat source 250 may include a graphics processing unit (GPU), both of which may be operated more intensively by the system from about time t4 to about time t6. Both curves 280 and 285 are in transition periods in which temperatures increase from about time t4 to about time t5. At about time t5, the first point reaches a steady-state temperature $T_{L2}$, and the second point reaches a steady-state temperature $T_{R2}$. At about time t6, both heat sources 240 and 250 decrease their rates of heat generation to levels below those at about time t3, and temperatures transition downward. For example, heat sources 240 and 250 may have reduced their intensities of operation. Heat source 240 remains at its rate of heat generation until about time t11, and the first point is at a steady-state temperature $T_{L3}$ from about time t7 to about time t11. Alternatively, heat source 240 may maintain the same rate of heat generation from about time t4 to about time t11, and instead at about time t6 heat rejection device 260 may increase its rate of heat rejection, such as by activation of a blower to change from passive heat rejection to active heat rejection (for example, temperature $T_{L2}$ may be above a target temperature for the first point). Heat source 250 remains at its rate of heat generation until about time t9, and the second point is at a steady-state temperature $T_{R3}$ from about time t8 (after time t7) to about time t9. At about time t9, heat source 250 increases its rate of heat generation, and the curve 285 transitions upward until the second point reaches a new steady-state temperature $T_{R4}$ at about time t10. During a first time period from about time t8 to about time t9 and a second time period from about time t10 to time t11, the heat transfer device is in thermal steady-state operation. At about time t11, both heat sources 240 and 250 decrease their rates of heat generation to levels below those at about time t8. Temperatures from curves 280 and 285 both transition downward until reaching respective steady-state temperatures $T_{L4}$ and $T_{R5}$ at about time t12.

Curve 290 provides a comparative illustration of performance of the conventional single-chambered vapor chamber in place of the heat transfer device 100. Curve 290 may reflect temperatures recorded at the first point and/or the second point. For example, where the first point measures a temperature of the heat source 240 and the second point measures a temperature of the heat source 250, those two temperatures may be essentially the same due to the isothermal nature of the single vapor chamber to which they are both thermally coupled. As illustrated in FIG. 2B, the temperatures for curve 290 are consistently above the temperatures for curve 280, including during periods of thermal steady-state. Additionally, from at time t9 to about t10, the temperature for curve 290 increases due to increased heat generation by heat source 250. In contrast, as illustrated by curves 280 and 285, the first thermal domain is thermally decoupled from the second thermal domain (although there may be some degree of "thermal crosstalk" in some examples, such as via the dividing wall 170), and increased heat generation by the heat source 250 has a substantially reduced effect on the temperature at the second point.

Differences in heat transport properties between the first and second thermal domains may be observed and/or measured in various ways. For example, for the heat transfer device 100:

With heat transfer device 100 operating in a thermal steady-state, a vapor temperature of the vapor phase 235 is substantially different than (including being greater than or being less than) a vapor temperature of the vapor phase 237. The difference may be substantial where the difference is significantly greater than normal temperature variation due to losses in vapor flow. In some examples, the difference is at least 5° C. In some examples, the difference is at least 10° C. In some examples, the difference is at least 20° C. The vapor temperatures may be average vapor temperatures within each chamber 102 and 104. The vapor temperatures may be measured around first and second evaporator regions 192 and 194. The vapor temperatures may be measured around first and second condenser regions 182 and 184. The vapor temperatures may be measured in corresponding adiabatic portions of the chambers. the thermal steady-state may be with substantially equal heat loads being supplied by heat sources 240 and 250 at their respective evaporator regions 192 and 194. The thermal steady-state may be with a system including the heat transfer device 100 being operated nominally (which may be referred to as a "nominal powered on thermal steady-state"), or being continuously operated for a minimum amount of time, such as, but not limited to, 10 minutes, 20 minutes, 30 minutes, 1 hour, or 2 hours. The thermal steady-state may be with a system including the heat transfer device 100 being and having been powered on for a minimum period of time, such as, but not limited to, 10 minutes, 20 minutes, 30 minutes, 1 hour, or 2 hours.

With heat transfer device 100 operating in a thermal steady-state, a first steady-state temperature at a first point for the first thermal domain is substantially different than (including being greater than or being less than) a second steady-state temperature at a corresponding second point for the second thermal domain. In some examples, the difference is at least 5° C. In some examples, the difference is at least 10° C. In some examples, the difference is at least 20° C. Various measurement points for thermal domains are discussed above in connection with FIG. 2B. In an example, the first point is heat source 240 and the second point is heat source 250. In an example, the first point is heat rejection device 260 and the second point is heat rejection device 270. For example, the heat transfer device 100 may be included in an electronic assembly, first point a user-exposed surface of heat rejection device 260, and the electronic assembly arranged such that the first steady-state temperature is at or below 40° C. (making user contact safe or comfortable) and the second steady-state temperature is at or above 50° C. In another example, the first point is within a fluid heated and output by heat rejection device 260 and the second point is within a fluid heated and output by heat rejection device 270. In an example, an electronic assembly including the heat transfer device 100 is arranged such that, when the electronic assembly is at a nominal powered on thermal steady-state, a user-exposed surface of the first heat rejection structure has a steady-state temperature at or below a 40° C. (or another temperature selected as safe or comfortable for user contact), and a temperature of the second heat rejection structure steady-state temperature of at or above 50° C. (or at least 10° C. higher than the steady-state temperature of the user-exposed surface). the thermal steady-state may be with substantially equal heat loads being supplied by heat sources 240 and 250 at their respective evaporator regions 192 and 194. The thermal steady-state may be with a system including the heat transfer device 100 being operated nominally (which may be referred to as a "nominal powered on thermal steady-state"), or being continuously operated for a minimum amount of time, such as, but not limited to, 10 minutes, 20 minutes, 30 minutes, 1 hour, or 2 hours. The thermal steady-state may be with a system including the heat transfer device 100 being and having been powered on for a minimum period of time, such as, but not limited to, 10 minutes, 20 minutes, 30 minutes, 1 hour, or 2 hours.

When the left chamber 102 is operating in a thermal steady-state at a first steady-state vapor temperature, a first heat transfer rate via the first heat transfer medium is substantially different than (including being greater than or being less than) a second heat transfer rate via the second heat transfer medium when the right chamber 104 is operating in a thermal steady-state at the first steady-state vapor temperature.

Characterization, computer modeling, and computer simulation may be used to guide design decisions to achieve targets for heat transfer properties under various operating conditions, and to investigate various structures and geometries for the left chamber 102 and the right chamber 104. For example, finite element software, such as COMSOL Multiphysics by COMSOL, Inc. of Stockholm, Sweden, may be used for numerical simulation of, among other things, capillary-driven fluid motion (for example, via surface tension modeling and the Navier-Stokes equation), vapor-phase transport (for example, via the Navier-Stokes equation), evaporation, condensation, heat transfer (including conduction, radiation, and convection for structures and heat transfer media), temperature distribution, heat adsorption, and stress analysis. Such approaches for design are not limited to the heat transfer device 100, but may further involve and/or account for other elements of a system in which the heat transfer device is included (as such elements, particularly in a densely constructed system, can affect heat transfer) and/or environmental conditions of such a system.

Figure 2C:
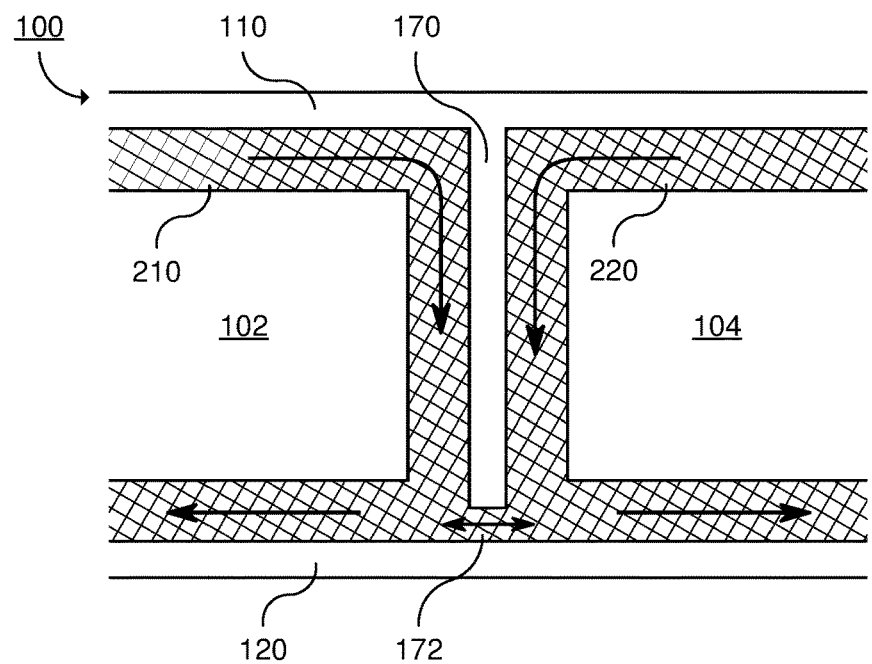
FIG. 2C illustrates an alternative embodiment in which a liquid phase of a heat transfer material may flow between two hermetic chambers included in the heat transfer device illustrated in FIG. 2A.

FIG. 2C illustrates an example of an alternative embodiment in which a liquid phase of a heat transfer material may flow between two hermetic chambers included in the heat transfer device 100 illustrated in FIG. 2A. In this example, the first heat transfer material is the same as the second heat transfer material (for example, water), and at least one channel 172 is included in the interior dividing wall 170 through which a liquid phase of a heat transfer medium by pass between the left chamber 102 and the right chamber 104. The heat transfer device illustrated in FIG. 2C is arranged such that the liquid phase of the heat transfer medium will pass through the channel 172, but the vapor phase of the heat transfer medium will not pass through the channel 172 due to the liquid phase being present in and around the channel 172. In the cross-section illustrated in FIG. 2C, dividing wall 170 does not reach the bottom wall 120; however, in nearby cross-sections wall 170 extends completely between the top wall 110 and the bottom wall 120. In some examples, as illustrated in FIG. 2C, a wick or porous material effective for transporting the liquid phase by capillary forces is disposed in the channel 172. In some examples, as illustrated in FIG. 2C, the channel 172 is completely covered by the wick 210 disposed in the left channel 102. In some examples, as illustrated in FIG. 2C, the channel 172 is completely covered by the wick 220 disposed in the left channel 104. In some examples, a portion of the channel 172 may be provided in the bottom wall 120. In some examples, the channel 172 may be provided in a middle portion of the dividing wall 170. A benefit of including the channel 172 is that a dryout condition, in which an inventory of the liquid phase becomes unavailable to an evaporator region and the evaporation-condensation cycle becomes stalled or broken and heat transport through a chamber is interrupted, can be avoided by making a greater inventory of the liquid phase available.

FIG. 2D illustrates a cross-section view, corresponding to the cross-section labeled "2D" in FIG. 1A, of the heat transfer device 100 illustrated in FIGS. 1A, 1B, 1C, and 2A. The interior of the left chamber 102 has a low first aspect ratio (substantially less than 1:1) in a first cross-section (for example, the cross-section illustrated in FIG. 2A) and a low second aspect ratio in a second cross-section perpendicular to the first cross-section (for example, the cross-section illustrated in FIG. 2D). The term "aspect ratio" refers to a height/width ratio (where the width is the longer of the two). A width may be measured as a distance along a linear path or a curvilinear path (for a curved chamber or a chamber with a complex shape, for example) within an interior of a chamber and between opposing ends or sides of the chamber. A height may be an average height along a path used to measure the width (in some implementations, an internal height may vary within a vapor chamber). For example, the first aspect ratio may be a ratio of a height of the left chamber 102 measured along the Z-axis and a width of the left chamber 102 measured along the Y-axis, and the second aspect ratio of the left chamber 102 may be a ratio of a height of the left chamber 102 measured along the same Z-axis and a width of the left chamber 102 measured along the X-axis. In some implementations, both of the first and second aspect ratios are less than 1:4. In some implementations, both of the first and second aspect ratios are less than 1:8. In some implementations, both of the first and second aspect ratios are less than 1:16. In some implementations, both of the first and second aspect ratios are less than 1:32.

FIG. 2E illustrates a cross-section view, corresponding to the cross-section labeled "2E" in FIG. 1A, of the heat transfer device 100 illustrated in FIGS. 1A, 1B, 1C, 2A, and 2D. As with the left chamber 102, the interior of the right chamber 104 has a low third aspect ratio in a third cross-section (for example, the cross-section illustrated in FIG. 2A) and a low fourth aspect ratio in a fourth cross-section perpendicular to the third cross-section (for example, the cross-section illustrated in FIG. 2E). In some implementations, both of the first and second aspect ratios are less than 1:4. In some implementations, both of the first and second aspect ratios are less than 1:8. In some implementations, both of the first and second aspect ratios are less than 1:16. In some implementations, both of the first and second aspect ratios are less than 1:32. In some implementations, all of the first, second, third, and fourth aspect ratios are less than 1:4. In some implementations, all of the first, second, third, and fourth aspect ratios are less than 1:8. In some implementations, all of the first, second, third, and fourth aspect ratios are less than 1:16. In some implementations, all of the first, second, third, and fourth aspect ratios are less than 1:32.

This description of features, systems, and components is not intended to be exhaustive and in other embodiments, heat transfer device 100 may include other features, systems, and/or components. Moreover, in other embodiments, some of these features, systems, and/or components could be optional. As an example, instead of having the five walls 110, 130, 140, 150, and 160, they may be replaced with a cap-like structure that still provides the two hermetically sealed left and right chambers 102 and 104 separated by the dividing wall 170.

In the embodiments that follow in FIGS. 3-11B, the reader may understand that the various features, properties, characteristics, materials, and/or arrangements as described above with reference to FIGS. 1A-2E may be equally applicable to the following embodiments. Thus, for example, although a heat transfer device or chamber included therein may not be specifically described below as including a feature, property, characteristic, material, and/or arrangement, it may be appreciated that the details provided above with respect to FIGS. 1A-2E may be incorporated in any of the following embodiments of FIGS. 3-11B.

Figure 3:
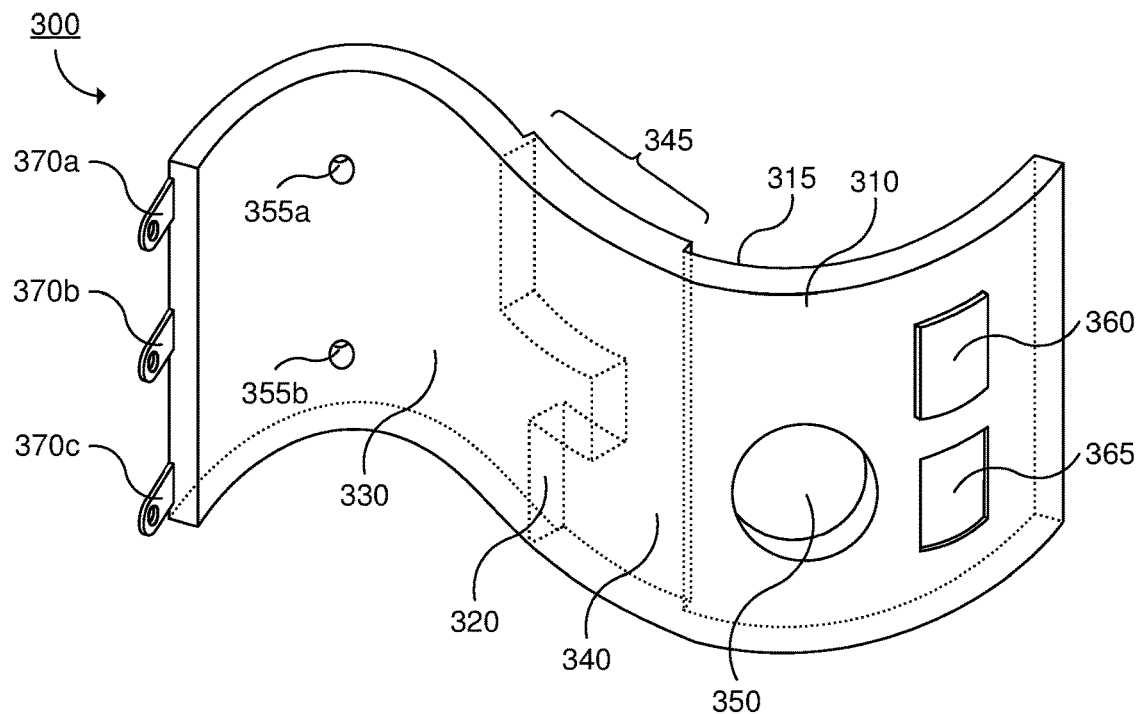
FIG. 3 shows a heat transfer device illustrating examples of features that may be selectively included in the heat transfer devices described herein.

FIG. 3 shows a heat transfer device 300 illustrating examples of features that may be selectively included in the heat transfer devices described herein. Additionally, the heat transfer device 300 may include the various features, properties, characteristics, materials, and/or arrangements as described above with reference to FIGS. 1A-2E. Heat transfer device 300 has a substantially curved shape with two major surface walls 310 and 315. In this example, the walls 310 and 315 are substantially parallel. Other, more complex shapes may be used to accommodate locations of components and elements within a system including the heat transfer device 300, as well as desired locations, mechanisms, and characteristics for heat rejection devices coupled to heat transfer device 300. For example, this can accommodate a non-planar or non-parallel arrangement of surfaces of heat sources in contact with the heat transfer device 300 (for example, top surfaces of integrated chip (IC) packages. Additionally, heat transfer device 300 may have a more complex "floor plan" than the generally rectangular examples illustrated thus far. Heat transfer device 300 includes a dividing wall 320, having a complex shape, which separates a hermetically sealed first chamber 330 located adjacent to a hermetically sealed second chamber 340, which may be configured and operated as described for the left and right chambers 102 and 104 with reference to FIGS. 1A-2E. The complex shape of dividing wall 320, and its effect on which portions of the exterior surfaces of heat transfer device 300 correspond to the first and second chambers 330 and 340, allows for more control and design flexibility for which thermal domains heat sources are included in and their locations. The second chamber 340 has variations in internal height, including a portion 345 having a greater interior height than other portions of the second chamber 340. More complex variations in internal height may be used for either of the first and second chambers 330 and 340. Variations in interior chamber height may be useful for increasing, directing, or otherwise controlling flow of a vapor phase of a heat transfer medium sealed in the second chamber 340. For example, the increased internal height may avoid restrictions in vapor flow for a condenser region or evaporator region included in the portion 345.

Heat transfer device 300 includes an aperture 350 passing therethrough. In this example, aperture 350 passes through the second chamber 340, but in other examples a single aperture may pass through multiple chambers. There is sealing around aperture 350 to ensure the second chamber 340 is hermetically sealed. Although aperture 350 is illustrated with a circular shape, other and more complex shapes may be used. Aperture 350 may be used for purposes such as, but not limited to, ensuring accurate positioning of the heat device 300 in a system, ensuring accurate positioning of elements of the system (including, for example, heat sources) relative to the heat device 300, mechanically securing heat transfer device 300 (including, for example, tapped through holes for fasteners), mechanically securing elements of the system to the heat transfer device 300 (including, for example, tapped through holes for fasteners), allowing a sensor (such as a camera or microphone) to sense an environment on an opposite side of the heat transfer device 300, passage of signals and/or power through heat transfer device 300, providing an improved thermal coupling with a heat source or heat rejection device, and/or passage of air through the heat transfer device 300. Heat transfer device 300 also includes similar, but smaller, apertures 355a and 355b which pass through the first chamber 330, and which may be arranged and utilized as discussed for aperture 350.

The wall 310 includes a convex or protruding portion 360 and a concave or depressed portion 365. In some examples, there is a corresponding change in internal chamber height. In some examples, wall 310 may have an increased thickness at protruding portion 360. In some examples, wall 310 may have a decreased thickness at depressed portion 365. Protruding portion 360 and/or depressed portion 365 may be included in or include an evaporator region or a condenser region. Protruding portion 360 and/or depressed portion 365, and the extents to which they protrude or are depressed, may be arranged to accommodate differences in distances between heat sources from heat transfer device 300 (for example, chips on a common substrate may be of different heights). The surfaces of protruding portion 360 and/or depressed portion 365 do not have to be parallel with a surrounding portion of a chamber wall; for example, they may be tiled or have complex non-planar surfaces. Protruding portion 360 may protrude more substantially than illustrated in FIG. 3 to thermally couple heat transfer device 300 to a heat source or heat rejection device that would otherwise not be immediately adjacent to heat transfer device 300.

Mounting structures 370a, 370b, and 370b are included on an exterior of heat transfer device, which may be used for purposes such as, but not limited to, ensuring accurate positioning of the heat device 300 in a system, ensuring accurate positioning of elements of the system (including, for example, heat sources) relative to the heat device 300, mechanically securing heat transfer device 300 (including, for example, tapped through holes for fasteners), and/or mechanically securing elements of the system to the heat transfer device 300 (including, for example, tapped through holes for fasteners). Such mounting structures may be located on essentially any exterior portion of heat transfer device 300.

Figure 4:
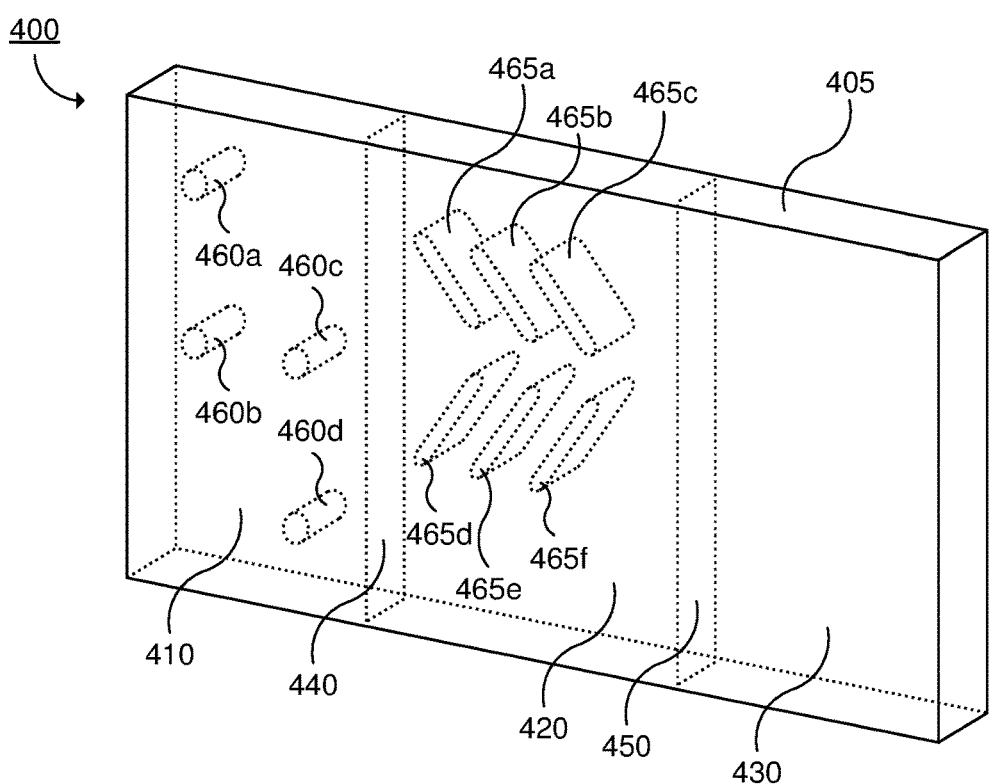
FIG. 4 shows a heat transfer device illustrating examples of additional features that may be selectively included in the heat transfer devices described herein.

FIG. 4 shows a heat transfer device 400 illustrating examples of additional features that may be selectively included in the heat transfer devices described herein. Heat transfer device 400 may include the various features, properties, characteristics, materials, and/or arrangements as described above with reference to FIGS. 1A-3. Heat transfer device 400 includes more than two chambers; specifically, a hermetically sealed first chamber 410, which is adjacent to a hermetically sealed second chamber 420, which in turn is adjacent to a hermetically sealed third chamber 430. The first and second chambers 410 and 420 have a shared dividing wall 440 therebetween, and the second and third chambers 420 and 430 have a shared dividing wall 450 therebetween. Chambers 410, 420, and 430 may be configured and operated as described for the chambers 102 and 104 with reference to FIGS. 1A-2E and/or the chambers 330 and 340 with reference to FIG. 3. Heat transfer device 400, as well as other heat transfer devices described herein, may have two or more chambers, with respective thermal domains each tuned to achieve target heat transfer properties, of varying sizes, shapes, and arrangements relative to each other. For example, the illustrated heat transfer device 400 might be modified to include a fourth chamber in which the wall 405 becomes an internal dividing wall, and the fourth chamber is adjacent to all of the chambers 410, 420, and 430. In an example, chamber 430 might be used as a heat rejection device for chamber 420, with dividing wall serving as a condenser region for chamber 420 and an evaporator region for chamber 430.

Chamber 410 includes internal structures 460a, 460b, 460c, and 460d; for example, support posts may be provided to mechanically support or strengthen chamber 410. Chamber 420 includes internal structures 465a, 465b, 465c, 465d, 465e, and 465f. Some or all of the structures may be used for mechanical support, improving rigidity, directing a liquid phase, or directing a vapor phase. In an example, one or more of internal structures 460a, 460b, 460c, 460d, 465a, 465b, 465c, 465d, 465e, and 465f may include wicking material to more directly convey a liquid phase between opposite sides of their chambers and/or to retain an inventory of the liquid phase.

Figure 5A:
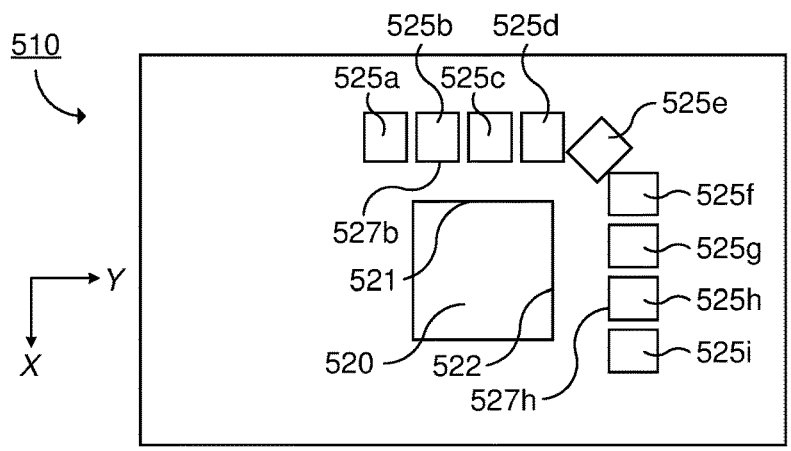
FIG. 5A illustrates an example of a substrate with electronic components mounted thereon and/or therein that are associated with two different thermal domains.

FIG. 5A illustrates an example of a substrate 510 with electronic components 520 and 525a-525i mounted thereon and/or therein that are associated with two different thermal domains. Substrate 510 may be, but is not limited to, a printed circuit board (PCB) providing mechanical support and electrical connections (for signaling and/or power, for example) for the electronic components 520 and 525a-525i. In some examples, electronic components for a single thermal domain may be across multiple substrates. In an example, electronic component 520 may be a microprocessor, GPU, or SoC, and electronic components 525a-525i may be memory devices (for example, DRAM, flash memory, and/or phase change memory devices). Electronic component 520 might, for example, generate substantial amounts of heat energy that preferably is not delivered to the electronic components 525a-525i. Conventionally, the solution to such an issue might be to couple electronic component to a heat pipe, and leave electronic components 525a-525i to be air cooled. A first edge 521 for electronic component 520 is spaced apart from a second edge 527b for electronic component 525b, and a third edge 522 for electronic component 520 is spaced apart from a fourth edge 527h for electronic component 525h.

Figure 5B:
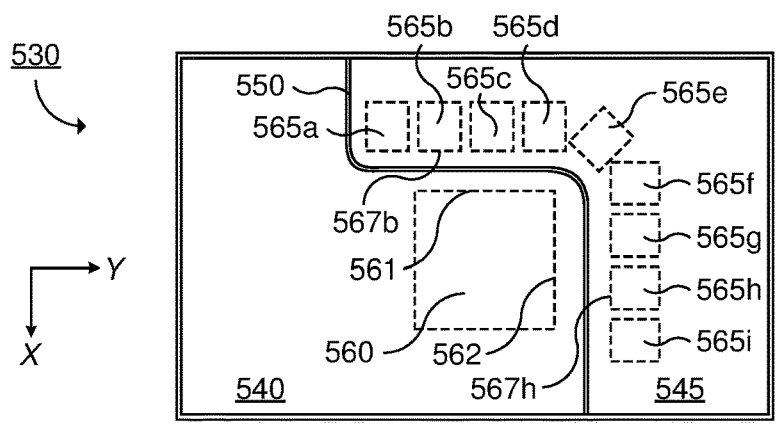
FIG. 5B illustrates an example of a heat transfer device that is adapted to provide first and second thermal domains for the electronic components shown in FIG. 5A.

FIG. 5B illustrates an example of a heat transfer device 530 that is adapted to provide first and second thermal domains for the electronic components 520 and 525a-525i shown in FIG. 5A. Heat transfer device 530 may include the various features, properties, characteristics, materials, and/or arrangements as described above with reference to FIGS. 1A-4. FIG. 5B shows a floor plan of the heat transfer device 530, with an internal dividing wall 550 between adjacent a hermetically sealed first chamber 540 for the first thermal domain and a hermetically sealed second chamber 545 for the second thermal domain. The wall 550 is shaped to include and/or exclude various components and areas for the two thermal domains. The first chamber 540 includes an evaporator region 560, which is adapter to be thermally coupled to the electronic component 520 illustrated in FIG. 5A. The second chamber 545 includes a plurality of evaporator regions 565a-565i adapted to be thermally coupled to the electronic components 525a-525i respectively. A first edge 561 for evaporator region 560 is spaced apart from a second edge 567b for evaporator region 565b, and the dividing wall 550 is positioned between the first and second edges 561 and 567b. A third edge 562 for evaporator region 560 is spaced apart from a fourth edge 567h for evaporator region 565h, and the dividing wall 550 is positioned between the third and fourth edges 562 and 567h.

Figure 5C:
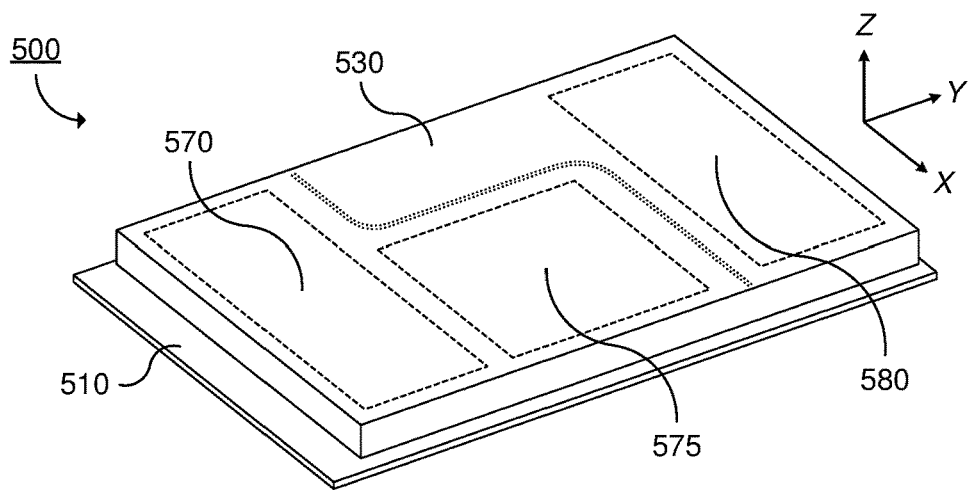
FIG. 5C illustrates an example electronic assembly with the substrate and electronic components illustrated in FIG. 5A coupled to the heat transfer device illustrated in FIG. 5B.

FIG. 5C illustrates an example electronic assembly 500 with the substrate 510 and electronic components 520 and 525a-525i illustrated in FIG. 5A coupled to the heat transfer device 530 illustrated in FIG. 5B. The electronic assembly may provide or be included in an electronic system. In electronic assembly 500, electronic component 520 is thermally coupled to evaporator region 560, and electronic components 525a-525i are thermally coupled to their respective evaporator regions 565a-565i. In the illustrated example, the first thermal domain includes condenser regions 570 and 575, which may be thermally coupled to respective heat rejection devices (not illustrated), and the second thermal domain includes condenser region 580. By this arrangement, heat generated by the electronic component 520 and management of that heat is decoupled from electronic components 525a-525i. Additionally, electronic components 525a-525i are able to exploit the high thermal conductivity available with chamber 545 for improved heat removal. In the example illustrated in FIG. 5C, the first chamber 540 covers the electronic component 560, and the second chamber 545 covers the electronic components 525a-525i. In some examples, as illustrated in FIG. 5C, the first chamber 540 and/or a bottom wall of first chamber 540 is not disposed above the electronic components 525a-525i, and the second chamber 545 is not disposed above the electronic component 560. Such arrangements ensure effective thermal coupling of the first chamber 540 to electronic component 560 and second chamber 545 to electronic components 525a-525i, and also improved thermal decoupling of electronic component 560 from electronic components 525a-525i.

Figure 6A:
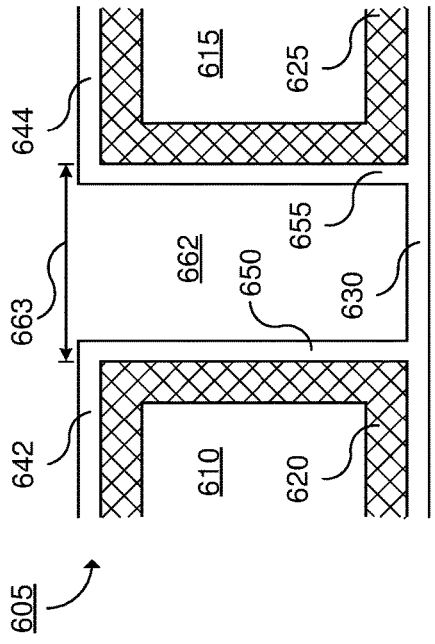
FIG. 6A illustrates an example heat transfer device with a vacuum or thermally insulating material disposed between two adjacent chambers.

FIG. 6A illustrates an example heat transfer device 600 with a vacuum or thermally insulating material disposed between two adjacent chambers 610 and 615. Heat transfer device 600 may include the various features, properties, characteristics, materials, and/or arrangements as described above with reference to FIGS. 1A-4 and 5B. Much as with the previously described heat transfer devices, the heat transfer device 600 includes a hermetically sealed first chamber 610 (for a first thermal domain), with a wick 620 therein, that is positioned adjacent to a hermetically sealed second chamber 615 (for a second thermal domain), with a wick 625 therein. In the example illustrated in FIG. 6A, the first chamber 610 is spaced apart from the second chamber 615 by a lateral distance 661. A top wall 640 defines both a top wall for the first chamber 610 and a top wall for the second chamber 615. A bottom wall 630 defines both a bottom wall for the first chamber 610 and a bottom wall for the second chamber 615.

Instead of the first chamber 610 and the second chamber 615 sharing a single interior dividing wall, as with the wall 170 illustrated in FIGS. 1C and 2A, the first chamber 610 includes a first dividing wall 650, which is adjacent to, but separated by a narrow thermally insulating chamber or gap 660 from, a second dividing wall 655 included in the second chamber 615. In some examples, a distance between the first and second dividing walls 650 and 655 is less than a height of chamber or gap 660. In some examples, the chamber or gap 660 may be hermetically sealed with a full or partial vacuum maintained within the sealed chamber or gap 660. The vacuum may be formed and chamber or gap 660 fully sealed during a filling procedure for the first chamber 610 and/or the second chamber 615. In some examples, the chamber or gap may be filled with a thermally insulating material. The thermal insulation provided by the chamber or gap 660 reduces "thermal crosstalk" between the first chamber 610 and the second chamber 620. Although there may be heat conduction through the walls 630 and 640, this arrangement substantially improves thermal decoupling of the first and second chambers 610 and 615 over a shared wall approach.

Figure 6B:
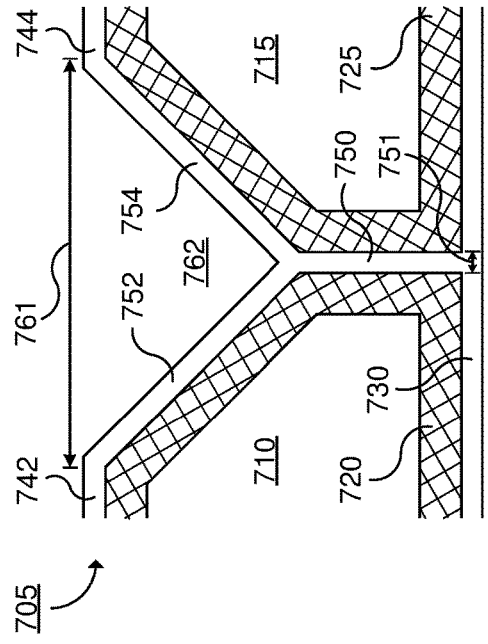
FIG. 6B illustrates an example heat transfer device with a gap between two adjacent chambers.

FIG. 6B illustrates an example heat transfer device 605 with a gap 662 between two adjacent chambers 610 and 615. Heat transfer device 605 may include the various features, properties, characteristics, materials, and/or arrangements as described above with reference to FIGS. 1A-4, 5B, and 6A. The heat transfer device 605 is arranged much as the heat transfer device 600 illustrated in FIG. 6A. However, instead of a common wall defining top walls of both chambers, in FIG. 6B the first chamber 610 includes a top wall 642 that is apart from a top wall 644 included in the second chamber 615. The bottom wall 630 still defines both a bottom wall for the first chamber 610 and a bottom wall for the second chamber 615. In the example illustrated in FIG. 6B, the first chamber 610 is spaced apart from the second chamber 615 by a lateral distance 663. In some examples, a distance between the first and second dividing walls 650 and 655 is less than a height of the first dividing wall 650 or the second dividing wall 655. The gap 662 between the first and second dividing walls 650 and 655 is left open and exposed. Although there may be heat conduction through the wall 630, this arrangement substantially improves thermal decoupling of the first and second chambers 610 and 615 over a shared wall approach.

Figure 7A:
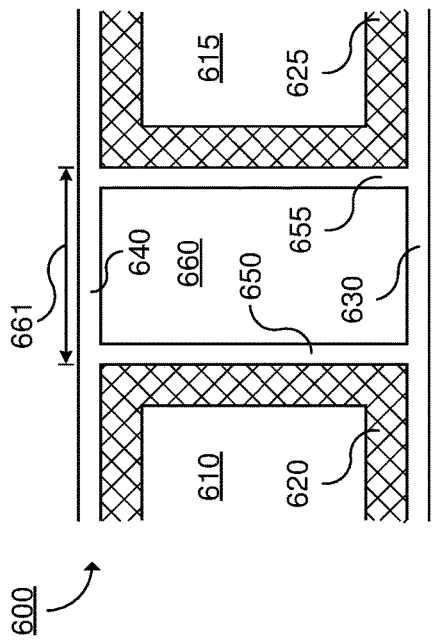
FIG. 7A illustrates an example heat transfer device with a vacuum or thermally insulating material disposed between two adjacent chambers.

FIG. 7A illustrates an example heat transfer device 700 with a vacuum or thermally insulating material disposed between two adjacent chambers 710 and 715. Heat transfer device 700 may include the various features, properties, characteristics, materials, and/or arrangements as described above with reference to FIGS. 1A-4, 5B, and 6A. Much as with the previously described heat transfer devices, the heat transfer device 700 includes a hermetically sealed first chamber 710 (for a first thermal domain), with a wick 720 therein, that is positioned adjacent to a hermetically sealed second chamber 715 (for a second thermal domain), with a wick 725 therein. A top wall 740 defines both a top wall for the first chamber 710 and a top wall for the second chamber 715. A bottom wall 730 defines both a bottom wall for the first chamber 710 and a bottom wall for the second chamber 715.

In FIG. 7A, a chamber or gap 760 is provided that is similar to the chamber or gap 660 in FIG. 6A, except the chamber of gap 760 provides a separation for only a portion of the area between the first and second chambers 710 and 715. Chamber or gap 760 may be described as partially separating the first and second chambers 710 and 715. A partial dividing wall 750 is shared by and provides a wall defining the first and second chambers 710 and 715. At a top of the partial dividing wall 750, there is a split into two walls: a dividing wall 752 that defines the first chamber 710 and a dividing wall 754 that defines the second chamber 714. Although FIG. 7A illustrates a 'Y' shape for dividing walls 750, 752, and 754, other arrangements of walls may be used to define the chamber or gap 760. In the example illustrated in FIG. 7A, at the bottom, the first chamber 710 is spaced apart from the second chamber 715 by a first lateral distance 751 corresponding to a thickness of dividing wall 750. Beginning at the top of the dividing wall 750, the lateral distance at which the first chamber 710 is spaced apart from the second chamber 715 increases to a second lateral distance 761 at the top. This arrangement may be useful where it is desired for the first and second chambers 710 and 715 to be closer together on one side of the heat transfer device 700 than can be achieved with the arrangement illustrated in FIG. 6A; for example, where a first evaporator region for the first chamber 710 is positioned very close to a second evaporator region for the second chamber 715, allowing two very closely positioned heat sources to be in separate thermal domains. Although there may be heat conduction through the walls 730, 740, and 750, this arrangement improves thermal decoupling of the first and second chambers 710 and 715 over the shared wall approach illustrated in FIGS. 1C and 2A. In some examples, the lateral distance between the first and second chambers 710 and 715 may change more abruptly.

Figure 7B:
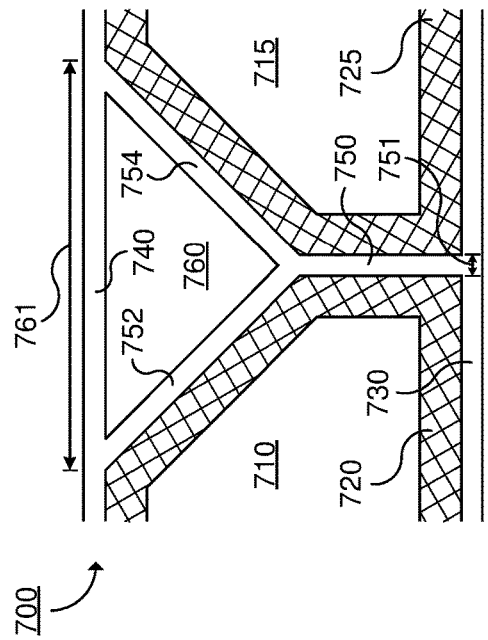
FIG. 7B illustrates an example heat transfer device with a gap between two adjacent chambers.

FIG. 7B illustrates an example heat transfer device 705 with a gap 762 between two adjacent chambers 710 and 715. Heat transfer device 705 may include the various features, properties, characteristics, materials, and/or arrangements as described above with reference to FIGS. 1A-4, 5B, 6A, 6B, and 7A. The heat transfer device 705 is arranged much as the heat transfer device 700 illustrated in FIG. 7A. However, instead of a common wall defining top walls of both chambers, in FIG. 7B the first chamber includes a top wall 742 that is apart from a top wall 744 included in the second chamber 615. The bottom wall 730 still defines both a bottom wall for the first chamber 710 and a bottom wall for the second chamber 715. The gap 762 between the first and second dividing walls 752 and 754 is left open and exposed. Although there may be heat conduction through the walls 730 and 750, this arrangement improves thermal decoupling of the first and second chambers 710 and 715 over the shared wall approach illustrated in FIGS. 1C and 2A. In some examples, the lateral distance between the first and second chambers 710 and 715 may change more abruptly.

Figure 8A:
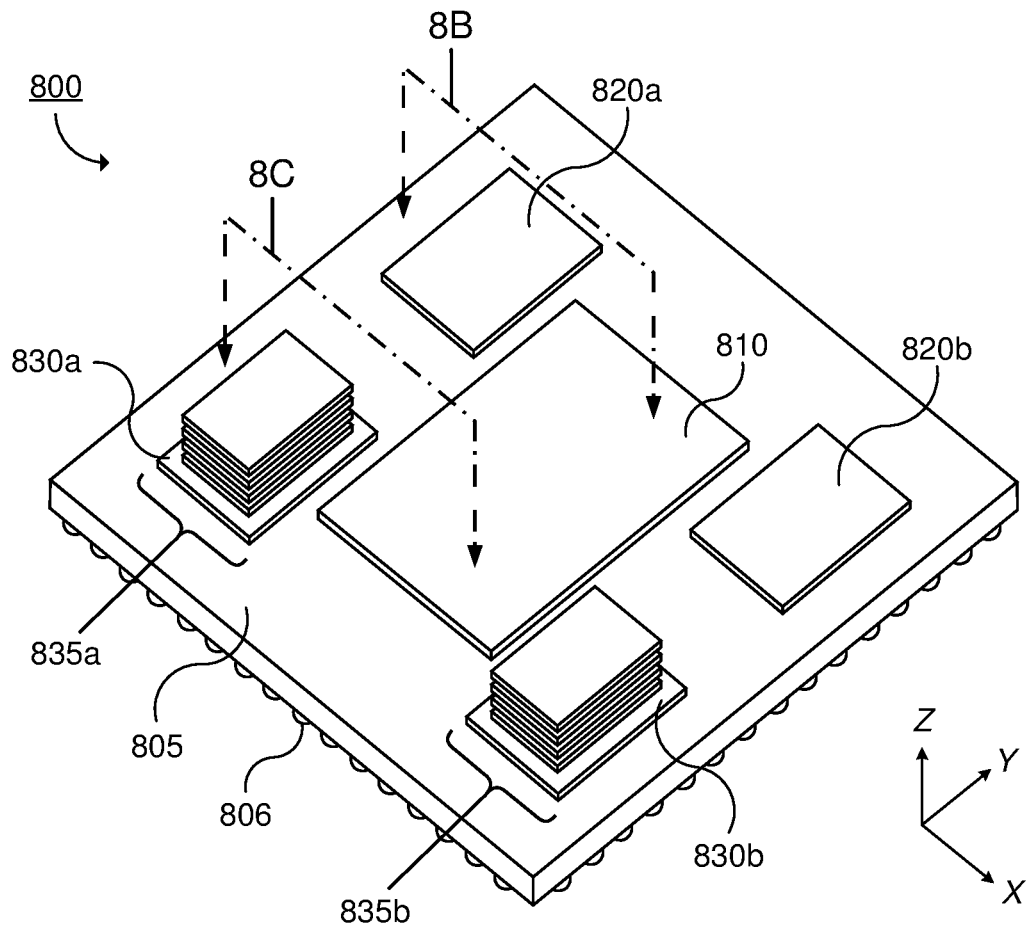
FIG. 8A illustrates an example of a multi-die package that may be thermally coupled to a heat transfer device to provide separate thermal domains for dice included in the multi-die package.

FIG. 8A illustrates an example of a multi-die package 800 that may be thermally coupled to a heat transfer device (not illustrated in FIG. 8A) to provide separate thermal domains for dice included in the multi-die package 800. Multi-die package 800 may also be referred to as a "multi-die chip carrier," "multi-chip package" or a "system in package." A die may also be referred to as a "chip" or a "substrate." Multi-die packaging may be used to, among other things, increase component density, improve manufacturing yields by reducing die sizes, heterogenous integration of dice produced using different processes (for example, different fabrication nodes such as 14 nm and 65 nm, or different substrate materials such as silicon and gallium nitride), higher communication bandwidth and/or lower latency between dice, and integration of dice produced by different vendors (for example, a logic die and a memory die) into a single package. With the increased component density in such packaging, there may be increased power density for which higher efficiency heat transfer is useful. Also, there may be different thermal demands or requirements for the dice included the multi-die package 800 that may be better achieved with the heat transfer devices described herein.

The multi-die package 800 includes a plurality of dice, including die 810, die 820a, die 820b, die 830a, and die 830b, that are mechanically and electrically coupled to a package substrate 805. In the example illustrated in FIG. 8A, the dice are coupled to a top of package substrate 805, but in other examples one or more dice may be located within the package substrate 805. The package substrate 805 also includes interconnection pins (for example, ball grid array pins), such as pin 806, for coupling the multi-die package 800 to a printed circuit board (PCB) or another electronic component and conducting electrical power and signals. The package substrate 805 further includes interconnects (not illustrated in FIG. 8A) within the package substrate 805 that provide electrical interconnections between and among the dice 810, 820a, 820b, 830a, and 830b, and the interconnection pins. In the example illustrated in FIG. 8A, the multi-die package 800 includes a first three-dimensional dice stack 835a that includes die 830a, and a second three-dimensional dice stack 835b that includes die 830b; however, in other examples, three-dimensional dice stacks may not be included. Such three-dimensional dice stacks have been employed for increasing capacity and density of memory devices, among other devices. In the example illustrated in FIG. 8A, a top surface of each of dice 810, 820a, and 820b, and three-dimensional dice stacks 835a and 835b are exposed, which improves thermal conductivity for heat transfer. However, in other examples the dice and/or three-dimensional dice stacks may be encapsulated, such as within a resin or ceramic material, and a heat transfer device used that provides separate thermal domains for dice included in the multi-die package 800. Dice and/or dice stacks included in the multi-die package may be referred to as individual electronic components.

Figure 8B:
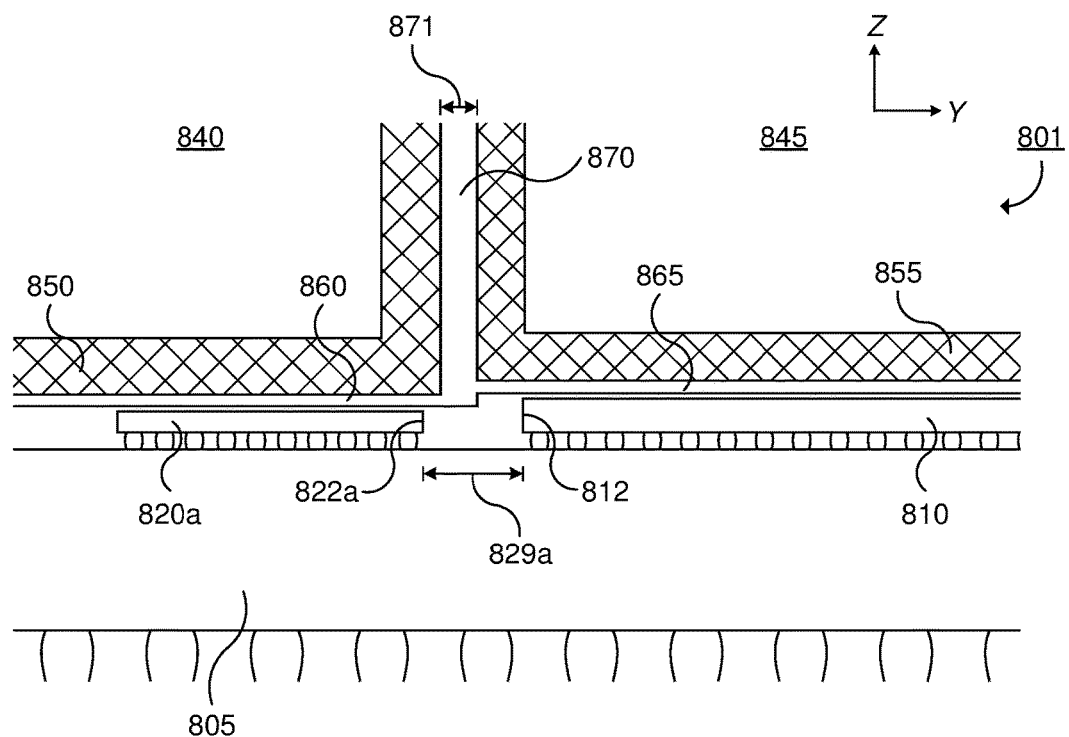
FIG. 8B illustrates an example cross-section (labeled "8B" in FIG. 8A) of the multi-die package illustrated in FIG. 8A and an example heat transfer device thermally coupled to, and providing separate thermal domains for, a first die and a second die included in the multi-die package.

FIG. 8B illustrates an example cross-section (labeled "8B" in FIG. 8A) of the multi-die package 800 illustrated in FIG. 8A and an example heat transfer device 801 thermally coupled to, and providing separate thermal domains for, a first die 810 and a second die 820a included in the multi-die package 800. Heat transfer device 801 may include the various features, properties, characteristics, materials, and/or arrangements as described above with reference to FIGS. 1A-4, 5B, and 6A-7B. In the example illustrated in FIG. 8B, the first die 810 is disposed laterally (in the X direction) from the second die 820a, with the first and second dice 810 and 820a spaced apart by a lateral distance 829a between a first inner edge 812 for the first die 810 and a second inner edge 822a for the second die 820a. Much as with the previously described heat transfer devices, the heat transfer device 801 includes a hermetically sealed first chamber 840 (for a first thermal domain), with a wick 850 therein, that is positioned adjacent to a hermetically sealed second chamber 845 (for a second thermal domain), with a wick 855 therein. A shared internal dividing wall 870 is illustrated, but arrangements such as those illustrated in FIGS. 6A-7B may also be employed.

In the example illustrated in FIG. 8B, the first chamber 840 is spaced apart from the second chamber 845 by a lateral distance 871; in this example, lateral distance 871 corresponds to a thickness of the dividing wall 870. The lateral distance 871 between the first and second chambers 840 and 845 is less than a lateral distance 829a between the first inner edge 812 for the first die 810 and the second inner edge 822a for the second die 820a. In this example, the dividing wall 870 and the entire corresponding lateral distance 871 are laterally positioned between the lateral positions of the first and second edges 812 and 822a. The first chamber 840 is disposed above the second die 820a and is thermally coupled to the second die 820a at a first evaporator region 860 of the first chamber 840. The second chamber 845 is disposed above the first die 810 and is thermally coupled to the first die 810 at a second evaporator region 865 of the second chamber 845. With this arrangement, first die 810 and second die 820a are in separate thermal domains, which may be tuned and operated separately as discussed previously. In some examples, die 820b may also be included in the same thermal domain as die 820a. In some examples, as illustrated in FIG. 8B, the first chamber 840 covers the second die 820a, including extending laterally across the second die 820a. In some examples, as illustrated in FIG. 8B, the second chamber 845 covers the first die 810, including extending laterally across the first die 810. In some examples, as illustrated in FIG. 8B, the first chamber 840 and/or a bottom wall of first chamber 840 is not disposed above the first die 810, and the second chamber 845 and/or a bottom wall of second chamber 845 is not disposed above the second die 822a. Such arrangements ensure effective thermal coupling of the first and second chambers 840 and 845 to their respective second and first dice 820a and 810, and also improved thermal decoupling of the first die 810 from the second die 820a. In some examples, the heat transfer device 801 and the first and second dice 810 and 820a may all be included in the multi-die package 800, to better ensure and maintain precise alignment and thermal coupling between the heat transfer device 801 and the first and second dice 810 and 820a over its lifespan.

Figure 8C:
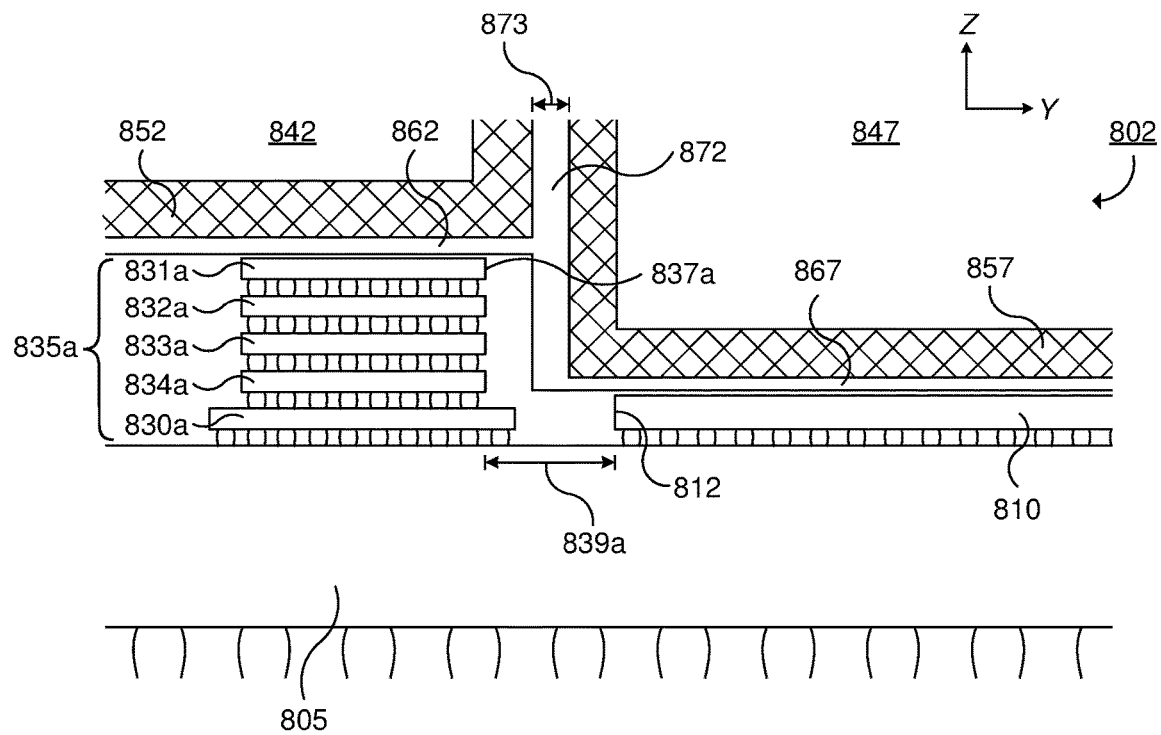
FIG. 8C illustrates an example cross-section (labeled "8C" in FIG. 8A) of the multi-die package illustrated in FIG. 8A and an example heat transfer device thermally coupled to, and providing separate thermal domains for, a die and a three-dimensional dice stack included in the multi-die package.

FIG. 8C illustrates an example cross-section (labeled "8C" in FIG. 8A) of the multi-die package 800 illustrated in FIG. 8A and an example heat transfer device 802 thermally coupled to, and providing separate thermal domains for, a die 810 and a three-dimensional dice stack 835a included in the multi-die package 800. Heat transfer device 802 may include the various features, properties, characteristics, materials, and/or arrangements as described above with reference to FIGS. 1A-4, 5B, 6A-7B, and 8B. In the example illustrated in FIG. 8B, the die 810 is disposed laterally (in the X direction) from the three-dimensional dice stack 835a, with a top surface of the die 810 and a top surface of the three-dimensional dice stack 835a spaced apart by a lateral distance 839a between a first inner edge 812 for the die 810 and a second inner edge 837a for the top die 831a of the three-dimensional dice stack 835a. Heat transfer device 802 is much like heat transfer device 801, and includes a hermetically sealed first chamber 842 (for a first thermal domain), with a wick 852 therein, that is positioned laterally adjacent to a second hermetically sealed chamber 847 (for a second thermal domain), with a wick 857 therein. A shared internal dividing wall 872 is illustrated, but arrangements such as those illustrated in FIGS. 6A-7B may also be employed.

In the example illustrated in FIG. 8C, the first chamber 842 is spaced apart from the second chamber 847 by a lateral distance 873; in this example, lateral distance 873 corresponds to a thickness of the dividing wall 872. The lateral distance 873 between the first and second chambers 842 and 847 is less than the lateral distance 839a between the first inner edge 812 for the die 810 and the second inner edge 837a for the three-dimensional dice stack 835a. In this example, the dividing wall 872 and the entire corresponding lateral distance 873 are laterally positioned between the lateral positions of the first and second edges 812 and 837a. The first chamber 842 is disposed above the top die 831a of the three-dimensional dice stack 835a and is thermally coupled to the three-dimensional dice stack 835a at a first evaporator region 862 of the first chamber 842. The second chamber 847 is disposed above the die 810 and is thermally coupled to the first die 810 at a second evaporator region 867 of the second chamber 847. With this arrangement, die 810 and three-dimensional dice stack 835a are in separate thermal domains, which may be tuned and operated separately as discussed previously. In some examples, three-dimensional dice stack 835b may also be included in the same thermal domain as three-dimensional dice stack 835a. In some examples, as illustrated in FIG. 8C, the first chamber 842 covers the three-dimensional dice stack 835a, including extending laterally across the top die 831a of the three-dimensional dice stack 835a. In some examples, as illustrated in FIG. 8C, the second chamber 847 covers the die 810, including extending laterally across the first die 810. In some examples, as illustrated in FIG. 8C, the first chamber 842 and/or a bottom wall of first chamber 842 is not disposed above the die 810, and the second chamber 847 and/or a bottom wall of second chamber 847 is not disposed above the three-dimensional dice stack 835a or die 831a. Such arrangements ensure effective thermal coupling of the first and second chambers 842 and 847 to their respective three-dimensional dice stack 835a and die 810, and also improved thermal decoupling of the three-dimensional dice stack 835a from the die 810. In some examples, the heat transfer device 802, die 810, and three-dimensional dice stack 835a may all be included in the multi-die package 800, to better ensure and maintain precise alignment and thermal coupling between the heat transfer device 802 and the dice included therein over its lifespan.

Figure 9A:
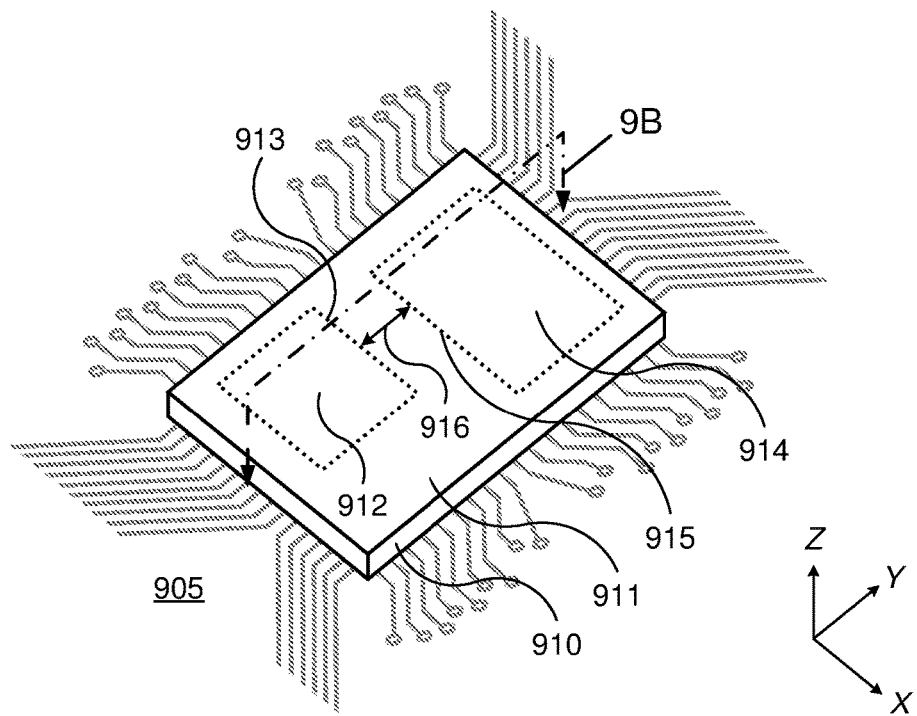
FIG. 9A illustrates an example of a die that may be thermally coupled to a heat transfer device to provide separate thermal domains for portions of a single die.

FIG. 9A illustrates an example of a die 910 that may be thermally coupled to a heat transfer device 901 (not illustrated in FIG. 9A) to provide separate thermal domains for portions of a single die 910. For example, die 910 may be, but is not necessarily, a system on a chip (SoC) that integrates multiple functions into a single die, such as, but not limited to, one or more microprocessors, a graphics processing unit (GPU), one or more coprocessors, a memory controller, memory (such as, but not limited to, ROM, RAM, and/or nonvolatile memory), radio frequency (RF) communications (such as cellular data or Wi-Fi), external interface controllers (for example, for Universal Serial Bus (USB), PCIe, and/or Ethernet), analog interfaces (such as, but not limited to, ADCs and/or DACs), voltage and/or power regulation circuits, and/or various peripheral and circuitry for interconnecting and controlling such functions. Such SoCs have been increasingly common for realizing smaller form factor devices (as a single SoC die may provide the functions otherwise provided using multiple separate dice and/or packages), adding special purpose functions to programmable devices, and reducing power consumption.

Figure 9B:
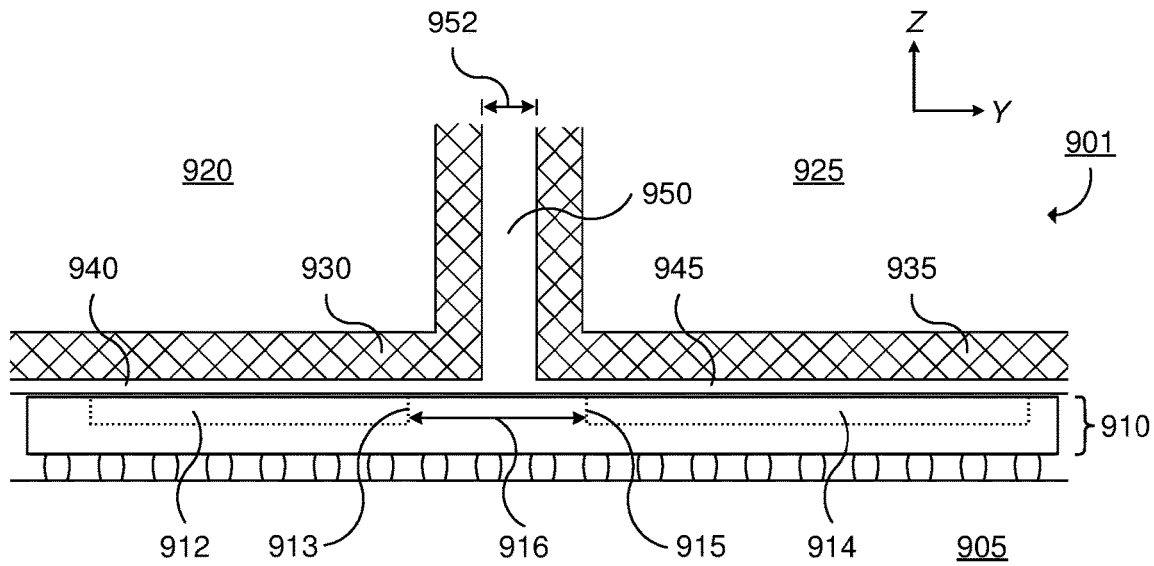
FIG. 9B illustrates an example cross-section (labeled "9B" in FIG. 9A) of the die illustrated in FIG. 9A and an example heat transfer device thermally coupled to, and providing separate thermal domains for, a first die portion and a second die portion included in the die.

Die 910 includes first and second die portions 912 and 914 for which separate thermal domains are provided by the heat transfer device 901. The first and second die portions 912 and 914 may be referred to as first and second electronic components. In the example illustrated in FIG. 9A, the first die portion 912 is disposed laterally (in the Y direction) from the second die portion 914, with the first and second die portions 912 and 914 spaced apart by a lateral distance 916 between a first inner edge 913 for the first die portion 912 and a second inner edge 915 for the second die portion 914. In some implementations, the first and second die portions 912 and 914 may be disposed immediately adjacent to each other. Many dice have uneven power densities under various operating conditions, which can result in die portions that may benefit from operating with a thermal domain separate from other portions of the die. In an example in which die 910 is an SoC in which the first die portion 912 corresponds to a first GPU function and the second die portion 914 corresponds to a second microprocessor function, rather than allowing periods of increased GPU activity, and resulting heat generated by the first die portion 912, to increase the temperature of other portions of die 910 (such as second die portion 914), a separate thermal domain may reduce thermal crosstalk between the first and second die portions 912 and 914 and provide a cooling solution tuned to the requirements for the first die portion 912 and/or the second die portion 914. As heat is more effectively transferred upward out of the die 910 than laterally across or through the die 910, the heat transfer device 901 is able to effectively reduce thermal crosstalk between different portions of a single die. It is noted that the first and/or second die portions 912 and 914 do not necessarily correspond to specific functions of the die 910. Although the example in FIG. 9A illustrates die 910 coupled directly to a PCB 905, in some other examples the die 910 may be mechanically and electrically coupled to a package substrate much as the first die 810 is coupled to the package substrate 805 illustrated in FIGS. 8A-8C. In the example illustrated in FIG. 9A, a top surface 911 of the die 910 is exposed, which improves thermal conductivity for heat transfer when thermally coupled to the heat transfer device 901, as illustrated in FIG. 9B. However, in other examples the die 910 may be encapsulated, such as within a resin or ceramic material, and a heat transfer device used that provides separate thermal domains for the first and second die portions 912 and 914 of the single die 910.

FIG. 9B illustrates an example cross-section (labeled "9B" in FIG. 9A) of the die 910 illustrated in FIG. 9A and an example heat transfer device 901 thermally coupled to, and providing separate thermal domains for, a first die portion 912 and a second die portion 914 included in the die 910. Heat transfer device 901 may include the various features, properties, characteristics, materials, and/or arrangements as described above with reference to FIGS. 1A-4, 5B, 6A-7B, and 8B. Much as with the previously described heat transfer devices, the heat transfer device 901 includes a hermetically sealed first chamber 920 (for a first thermal domain), with a wick 930 therein, that is positioned laterally adjacent to a hermetically sealed second chamber 925 (for a second thermal domain), with a wick 935 therein. A shared internal dividing wall 950 is illustrated, but arrangements such as those illustrated in FIGS. 6A-7B may also be employed. In the example illustrated in FIG. 9B, the first chamber 920 is spaced apart from the second chamber 925 by a lateral distance 952; in this example, lateral distance 952 corresponds to a thickness of the dividing wall 950. The lateral distance 952 between the first and second chambers 920 and 925 is less than the lateral distance 916 between the first inner edge 913 for the first die portion 912 and the second inner edge 915 for the second die portion 914. In this example, the dividing wall 950 and the entire corresponding lateral distance 952 are laterally positioned between the lateral positions of the first and second edges 913 and 914. The first chamber 920 is disposed above the first die portion 912 and is thermally coupled to the first die portion 912 at a first evaporator region 940 of the first chamber 920. The second chamber 925 is disposed above the second die portion 914 and is thermally coupled to the second die portion 914 at a second evaporator region 945 of the second chamber 925. With this arrangement, die portions 912 and 914, although included in the same die 910, are in separate thermal domains, which may be tuned and operated separately as discussed previously. In some examples, as illustrated in FIG. 9B, the first chamber 920 covers the first die portion 912, including extending laterally across the first die portion 912. In some examples, as illustrated in FIG. 9B, the second chamber 925 covers the second die portion 914, including extending laterally across the second die portion 914. In some examples, as illustrated in FIG. 9B, the first chamber 920 and/or a bottom wall of first chamber 920 is not disposed above the second die portion 914, and the second chamber 925 and/or a bottom wall of second chamber 925 is not disposed above the first die portion 912. Such arrangements ensure effective thermal coupling of the first and second chambers 920 and 925 to their respective first and second die portions 912 and 914, and also improved thermal decoupling of the first die portion 912 from the second die portion 914. In some examples, the heat transfer device 901 and the die 910 may both be included in a single package, to better ensure and maintain precise alignment and thermal coupling between the heat transfer device 901 and the die 910 over its lifespan. The techniques described in combination with FIGS. 9A and 9B may be combined with the techniques described in combination with FIGS. 8A-8C to provide multiple thermal domains for a single die included in a multi-die package.

Figure 10:
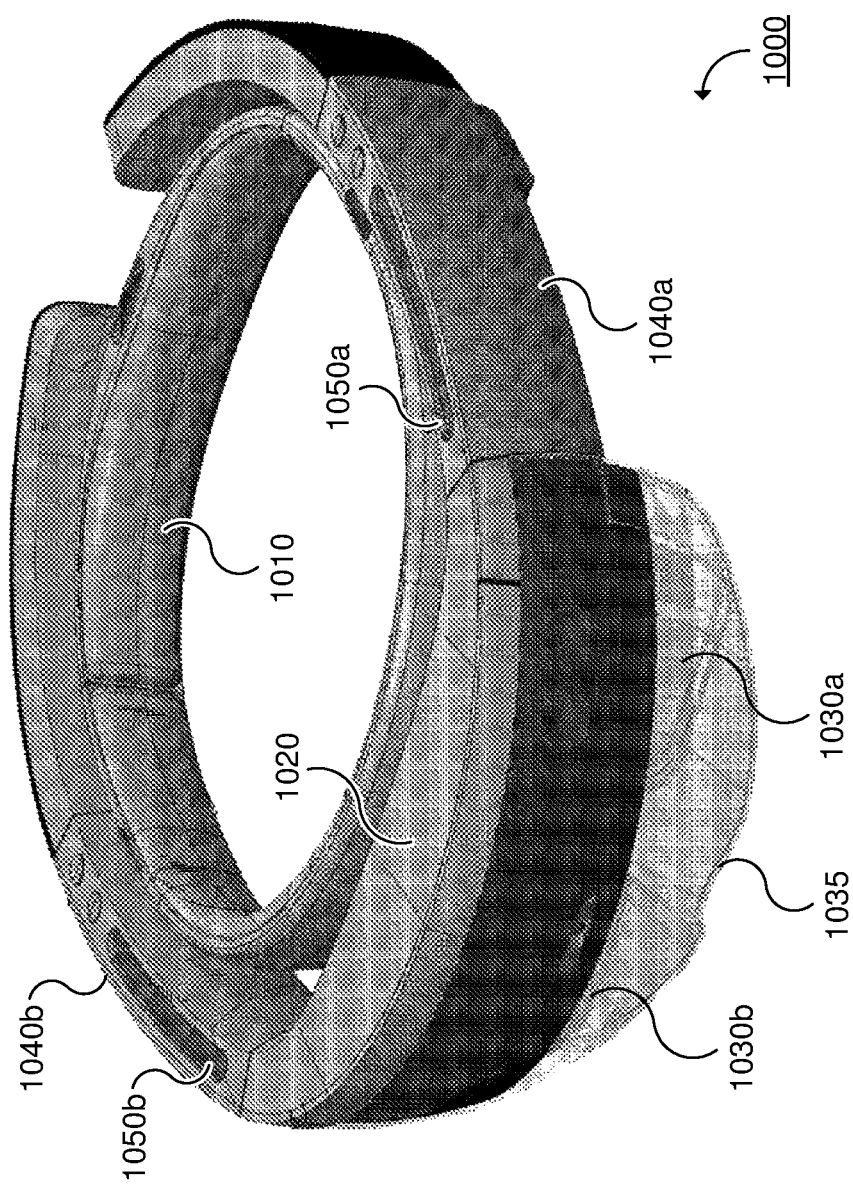
FIG. 10 illustrates an example of a portable electronic device incorporating a heat transfer device as discussed in previous examples.

FIG. 10 illustrates an example of a portable electronic device 1000 incorporating a heat transfer device as discussed in previous examples. The portable electronic device 1000 and various portions including electronic components, may each be referred to as an "electronic assembly." Portable electronic device 1000 includes a heat transfer device (not illustrated in FIG. 10) which may include the various features, properties, characteristics, materials, and/or arrangements as described above with reference to FIGS. 1A-4, 5B, 6A-7B, 8B, 8C, and 9B. In the example illustrated in FIG. 10, the portable electronic device 1000 includes a head mounted display (HMD) and associated electronic components. Such HMDs may be used for virtual reality (VR), augmented reality (AR), and mixed reality (MR) applications. The particular example illustrated in FIG. 10 is a self-contained AR device including electronic components used for sensing, computing, signal processing, graphics processing, and display functions, among others. The illustrated portable electronic device 1000 is similar in many respects to the HoloLens by Microsoft of Redmond, Wash., US. Examples of similar devices are described in U.S. Patent Application Publication Nos. 2016/0212888 (published on Jul. 21, 2016) and 2017/0099749 (published on Apr. 6, 2017), which are each incorporated herein by reference in their entireties. Portable electronic device 1000 includes a headband 1010 for placing the portable electronic device 1000 on a user's head. Portable electronic device 1000 includes an electronic processing section, which includes heat generating electronic components for which heat needs to be removed. Portable electronic device 1000 includes a left see-through display device 1030a for a user's left eye and a right see-through display device 1030b for a user's right eye, for which a protective shield 1035 is provided. Portable electronic device 1000 uses a first heat rejection device 1040a and a second heat rejection device 1040b for rejecting heat. First heat rejection device 1040a includes a thermal tunnel 1050a which improves heat rejection, and second heat rejection device 1040b includes a similar thermal tunnel.

Figure 11A:
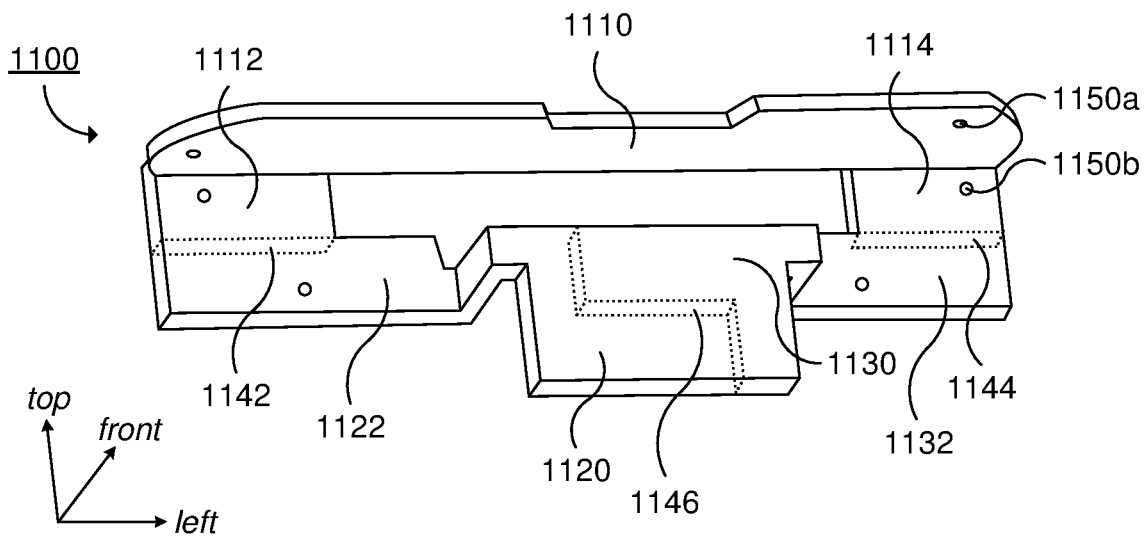
FIG. 11A illustrates an example heat transfer device arranged to provide multiple thermal domains for the portable electronic device illustrated in FIG. 10.

FIG. 11A illustrates an example heat transfer device 1100 arranged to provide multiple thermal domains for the portable electronic device 1000 illustrated in FIG. 10. Heat transfer device 1100 may include the various features, properties, characteristics, materials, and/or arrangements as described above with reference to FIGS. 1A-4, 5B, 6A-7B, 8B, 8C, and 9B. Heat transfer device 1100 defines three thermal domains: a first thermal domain including subchambers 1110, 1112, and 1114 that together provide a hermetically sealed first vapor chamber, a second thermal domain including subchambers 1120 and 1122 that together provide a hermetically sealed second vapor chamber, and a third thermal domain including subchambers 1130 and 1132 that together provide a hermetically sealed third vapor chamber. There is a first dividing wall 1142 between subchambers 1112 and 1142 which, in some examples, may be arranged much as illustrated in FIGS. 6A-7B. There is a second dividing wall 1144 between subchambers 1114 and 1144 which, in some examples, may be arranged much as illustrated in FIGS. 6A-7B. There is a third dividing wall 1146 between subchambers 1120 and 1130 which, in some examples, may be arranged much as illustrated in FIGS. 6A-7B. In some examples, the subchamber 1110 may be divided into two subchambers with an additional dividing wall, thereby providing two thermal domains in place of the first thermal domain. Heat transfer device 1100 includes a plurality of apertures, including apertures 1150a and 1150b, for attaching heat transfer device 1100 to portable electronic device 1000.

Figure 11B:
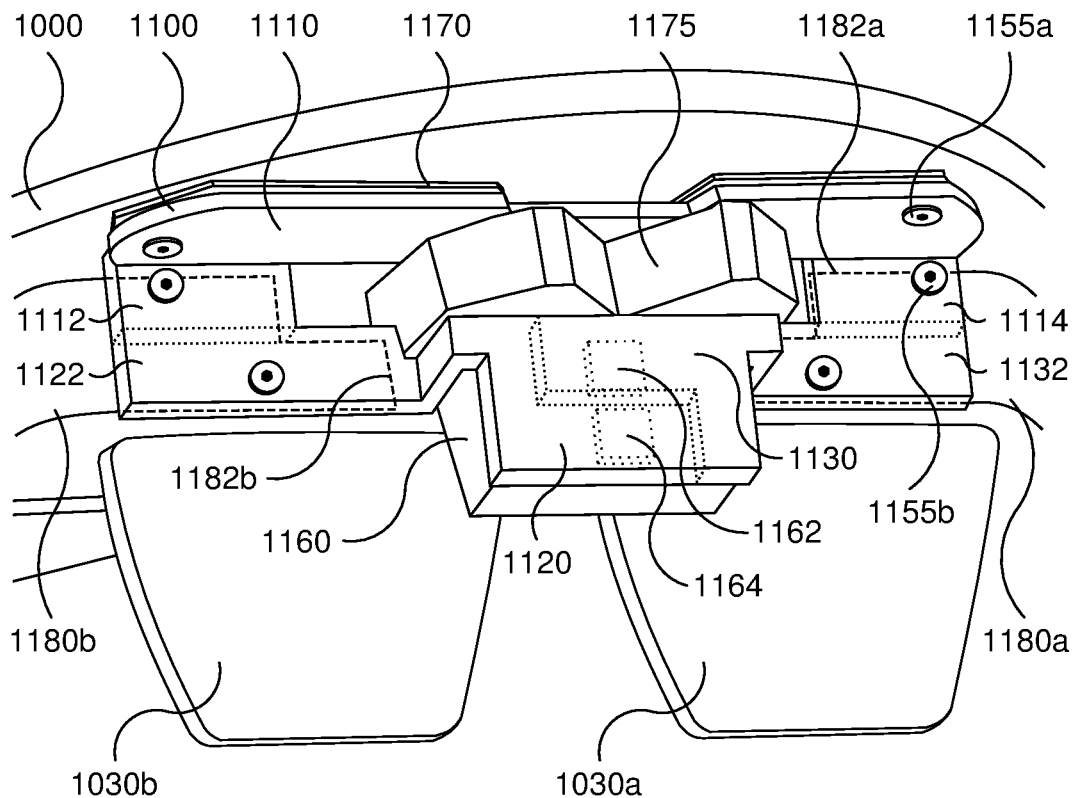
FIG. 11B illustrates an example in which the heat transfer device illustrated in FIG. 11A is included in the portable electronic device illustrated in FIG. 10.

FIG. 11B illustrates an example in which the heat transfer device 1100 illustrated in FIG. 11A is included in the portable electronic device 1000 illustrated in FIG. 10. Portable electronic device 1000 includes a first processing section 1160 that includes a first electronic component 1162 and a second electronic component 1164. The first electronic component 1162 is thermally coupled to an evaporator region of the subchamber 1120 of the second thermal domain. The second electronic component is thermally coupled to an evaporator region of the subchamber 1130 of the third thermal domain. Portable electronic device 1000 includes a second processing section 1170 including a plurality of electronic components mounted on one or more PCBs and thermally coupled to respective evaporator regions of the subchamber 1110 of the first thermal domain. Portable electronic device 1000 includes a sensor unit 1175 which may be thermally coupled to the heat transfer device 1100, such as to the first thermal domain. A plurality of fasteners, including hex screws 1155a and 1155b inserted in respective apertures 1150a and 1150b, are inserted through the apertures in the heat transfer device 1100 to mechanically secure heat transfer device 1100 on portable electronic device 1000.

In FIG. 11B, portable electronic device 1000 also includes a first thermal conduit 1180a that is arranged to conduct heat to heat rejection device 1040a, and a second thermal conduit 1180b that is arranged to conduct heat to heat rejection device 1040b. The first thermal conduit 1180a includes an end 1182a with a first portion thermally coupled to a condenser region of subchamber 1114 of the first thermal domain, and a second portion thermally coupled to a condenser region of subchamber 1132 of the third thermal domain. The subchamber 1132 has a larger area of contact with thermal conduit 1180a, allowing it to reject heat at a higher rate than subchamber 1114. Likewise, the second thermal conduit 1180b includes an end 1182b with a first portion thermally coupled to a condenser region of subchamber 1112 of the first thermal domain, and a second portion thermally coupled to a condenser region of subchamber 1142 of the second thermal domain. Examples of thermal conduit in HMDs are described in U.S. Patent Application Publication Nos. 2016/0212879 (published on Jul. 21, 2016) and 2016/0381832 (published on Dec. 29, 2016), which is incorporated herein by reference in its entirety. The subchamber 1142 has a larger area of contact with thermal conduit 1180*b*, allowing it to reject heat at a higher rate than subchamber 1112. With the illustrated use of the heat rejection device 1100, portable electronic device 1000 can exploit the various benefits described above for multiple thermal domains.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. A heat transfer device comprising:
    a substantially continuous first surface wall forming a bottom side of the heat transfer device;
    a hermetic first chamber of a first design, wherein the first surface wall provides a bottom wall of the first chamber;
    a hermetic second chamber of a second design different from the first design, positioned adjacent to the first chamber along a length of the first surface wall, wherein the first surface wall provides a bottom wall of the second chamber;
    a first side wall portion of the first chamber, wherein the first side wall portion is directly attached to the first surface wall;
    a second side wall portion of the second chamber, wherein the second side wall portion is directly attached to the first surface wall and adjacent to the first side wall portion of the first chamber; and
    a thermally insulating chamber disposed between the first side wall portion and the second side wall portion, the thermally insulating chamber being hermetically sealed with a full or partial vacuum maintained within the thermally insulating chamber
    a first heat transfer medium disposed in the first chamber;
    a first wick disposed in the first chamber and arranged to transport a liquid phase of the first heat transfer medium by capillary forces to an evaporator region of the first chamber;
    a second heat transfer medium disposed in the second chamber; and
    a second wick disposed in the second chamber and arranged to transport a liquid phase of the second heat transfer medium by capillary forces to an evaporator region of the second chamber.

2. The heat transfer device of claim 1, wherein a total internal volume of the first chamber is greater than a total internal volume of the second chamber.

3. The heat transfer device of claim 1, wherein
    the first wick includes a wick portion disposed on a continuous second wall of the heat transfer device;
    the second wick includes a wick portion disposed on the second wall;

the wick portion of the first wick and the wick portion of the second wick have different average wick thicknesses, different average pore sizes, or comprise different wick materials.

4. The heat transfer device of claim 1, wherein a total mass of the first heat transfer medium disposed in the first chamber is greater than a total mass of the second heat transfer medium disposed in the second chamber.

5. The heat transfer device of claim 1, wherein when the heat transfer device is operating in a thermal steady-state in which a first heat load is being supplied to the evaporator region of the first chamber and a second heat load, equal to the first heat load, is being supplied to the evaporator region of the second chamber, a vapor temperature of the first heat transfer medium around the evaporator region of the first chamber is 5° C. to 20° C. greater than a vapor temperature of the second heat transfer medium around the evaporator region of the second chamber.

6. The heat transfer device of claim 1, wherein when the first chamber is operating in a thermal steady-state at a first steady-state vapor temperature, a heat transfer rate via the first heat transfer medium is greater than a heat transfer rate via the second transfer medium when the second chamber is operating in a thermal steady-state at the first vapor temperature.

7. The heat transfer device of claim 1, further comprising:
a first heat rejection structure thermally coupled to the first chamber via a first amount of surface area of an exterior surface of the first chamber and arranged to receive at least 50% of latent heat released by condensation of the first heat transfer medium; and
a second heat rejection structure thermally coupled to the second chamber via a second amount of surface area of an exterior surface of the second chamber and arranged to receive at least 50% of latent heat released by condensation of the second heat transfer medium,
wherein the first amount of surface area is 30% to 100% greater than the second amount of surface area.

8. An electronic assembly comprising:
the heat transfer device of claim 1;
a first electronic component that generates heat during operation of the electronic assembly, is thermally coupled to the first chamber of the heat transfer device, and is arranged to vaporize the first heat transfer medium included in the heat transfer device at the evaporator region of the first chamber during operation of the electronic assembly; and
a second electronic component that generates heat during operation of the electronic assembly, is thermally coupled to the second chamber of the heat transfer device, and is arranged to vaporize the second heat transfer medium included in the heat transfer device at the evaporator region of the second chamber during operation of the electronic assembly.

9. The electronic assembly of claim 8, wherein a total internal volume of the first chamber is 20% to 100% greater than a total internal volume of the second chamber.

10. The electronic assembly of claim 8, wherein the electronic assembly is arranged such that, when a temperature of the first electronic component has increased to a first steady-state temperature and a temperature of the second electronic component has increased to a second steady-state temperature while the electronic assembly is operating in a power on state, a vapor temperature of the first heat transfer medium around the evaporator region of the first chamber is 5° C. to 20° C. greater than a vapor temperature of the second heat transfer medium around the evaporator region of the second chamber.

11. The electronic assembly of claim 8, wherein the electronic assembly is arranged such that, when the electronic assembly is at a nominal powered on thermal steady-state, a first steady-state temperature of the first electronic component is 5° C. to 20° C. greater than a second steady-state temperature of the second electronic component.

12. The electronic assembly of claim 8, further comprising:
a first heat rejection device thermally coupled to the first chamber via a first amount of surface area of an exterior surface of the first chamber and arranged to receive more than 50% of latent heat released by condensation of the first heat transfer medium during operation of the electronic assembly; and
a second heat rejection device thermally coupled to the second chamber via a second amount of surface area of an exterior surface of the second chamber and arranged to receive at least 50% of latent heat released by condensation of the second heat transfer medium during operation of the electronic assembly,
wherein the first amount of surface area is 30% to 100% greater than the second amount of surface area.

13. The electronic assembly of claim 8, further comprising:
a first heat rejection device thermally coupled to the first chamber, including a user-exposed surface, and arranged to receive at least 50% of latent heat released by condensation of the first heat transfer medium during operation of the electronic assembly; and
a second heat rejection device thermally coupled to the second chamber and arranged to receive at least 50% of latent heat released by condensation of the second heat transfer medium during operation of the electronic assembly,
wherein the electronic assembly is arranged such that, when the electronic assembly is at a nominal powered on thermal steady-state, the user-exposed surface of the first heat rejection device is at or below 40° C., and a temperature of the second heat rejection structure is at or above 50° C.

14. The electronic assembly of claim 8, further comprising:
a passive heat rejection structure thermally coupled to the first chamber; and
an active heat rejection structure thermally coupled to the second chamber.

15. The electronic assembly of claim 8, further comprising a heat sink thermally coupled to the first chamber and the second chamber via the first surface wall of the heat transfer device, arranged to receive at least 50% of latent heat released by condensation of the first heat transfer medium, and arranged to receive at least 50% of latent heat released by condensation of the second heat transfer medium.

16. The electronic assembly of claim 8, wherein the electronic assembly comprises a head-mounted display device including the first chamber, the second chamber, the first surface wall of the heat transfer device, the first electronic component, and the second electronic component.

17. The electronic assembly of claim 8, wherein:
the first electronic component is a first die portion of a die; and
the second electronic component is a second die portion of the die.

18. The electronic assembly of claim 8, wherein:
the first electronic component is a first die included in a multi-die chip carrier; and
the second electronic component is a second die included in the multi-die chip carrier.

19. A method of cooling components in an electronic device, the method comprising:
including a heat transfer device according to claim 1;
thermally coupling a first electronic component that generates heat during operation of the electronic assembly to the first chamber of the heat transfer device;
vaporizing a portion of the first heat transfer medium included in the heat transfer device by transferring heat from the first electronic component to the evaporator region of the first chamber;
thermally coupling a second electronic component that generates heat during operation of the electronic assembly to the second chamber of the heat transfer device;
vaporizing a portion of the second heat transfer medium by transferring heat included in the heat transfer device from the second electronic component to the evaporator region of the second chamber.

\* \* \* \* \*